US010290297B2

(12) United States Patent
Niibe et al.

(10) Patent No.: US 10,290,297 B2
(45) Date of Patent: May 14, 2019

(54) SOUND EFFECT GENERATION DEVICE FOR VEHICLES

(71) Applicant: MAZDA MOTOR CORPORATION, Hiroshima (JP)

(72) Inventors: Tadayuki Niibe, Yawatahama (JP); Naoki Yamada, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 0 days.

(21) Appl. No.: 15/762,401

(22) PCT Filed: Mar. 15, 2017

(86) PCT No.: PCT/JP2017/010343
§ 371 (c)(1),
(2) Date: Mar. 22, 2018

(87) PCT Pub. No.: WO2017/169767
PCT Pub. Date: Oct. 5, 2017

(65) Prior Publication Data

US 2018/0268805 A1 Sep. 20, 2018

(30) Foreign Application Priority Data

Mar. 31, 2016 (JP) ................................ 2016-071384

(51) Int. Cl.
*H04B 1/00* (2006.01)
*G10K 15/02* (2006.01)
(Continued)

(52) U.S. Cl.
CPC ............... *G10K 15/02* (2013.01); *H04R 1/28* (2013.01); *H04R 3/00* (2013.01); *H04R 2499/13* (2013.01)

(58) Field of Classification Search
CPC ........ G10K 15/02; G10K 15/04; B60R 11/02; H04R 1/28; H04R 3/00
(Continued)

(56) References Cited

U.S. PATENT DOCUMENTS

2003/0191568 A1* 10/2003 Breed .................. B60W 40/06 701/36
2009/0028353 A1 1/2009 Kobayashi et al.
2010/0202622 A1* 8/2010 Hardee .............. H04M 19/044 381/57
2012/0177214 A1 7/2012 Hera et al.
2015/0170629 A1* 6/2015 Christoph ................ G10H 5/00 381/61

FOREIGN PATENT DOCUMENTS

JP H10-269495 A 10/1998
JP H11-078689 A 3/1999
(Continued)

OTHER PUBLICATIONS

International Search Report issued in PCT/JP2017/010343; dated May 30, 2017.
(Continued)

*Primary Examiner* — Xu Mei
*Assistant Examiner* — Ammar T Hamid
(74) *Attorney, Agent, or Firm* — Studebaker & Brackett PC

(57) ABSTRACT

A vehicle sound effect generation apparatus generates a sound effect of an engine based on a vibration sound database including a fundamental wave sound having a fundamental frequency component and a plurality of adjustment wave sounds having a frequency component other than the fundamental frequency component. The vehicle sound effect generation apparatus includes a running state detecting unit that detects a running state of a vehicle, a risk degree determining unit that is capable of determining a risk degree
(Continued)

of the vehicle based on the running state detected by the running state detecting unit, and a sound effect generation unit that, when the risk degree determining unit determines a risk degree which is a predetermined value or more, synthesizes the fundamental wave sound with one or more discordant adjustment wave sounds having a discordant frequency component other than an integer-order frequency component and a half-order frequency component.

5 Claims, 12 Drawing Sheets

(51) Int. Cl.
*H04R 3/00* (2006.01)
*H04R 1/28* (2006.01)
*H03G 3/00* (2006.01)

(58) Field of Classification Search
USPC ........................................................ 381/86
See application file for complete search history.

(56) References Cited

FOREIGN PATENT DOCUMENTS

| | | | |
|---|---|---|---|
| JP | 2004-074994 | A | 3/2004 |
| JP | 2004-078036 | A | 3/2004 |
| JP | 2006-096070 | A | 4/2006 |
| JP | 2008-025492 | A | 2/2008 |
| JP | 2010-175854 | A | 8/2010 |
| JP | 2014-507679 | A | 3/2014 |

OTHER PUBLICATIONS

Extended European Search Report issued by the European Patent Office dated Nov. 21, 2018, which corresponds to EP17774311.9-1132 and is related to U.S. Appl. No. 15/762,401.

* cited by examiner

SOUND EFFECT GENERATION DEVICE FOR VEHICLES

TECHNICAL FIELD

The present invention relates to a vehicle sound effect generation apparatus and particularly relates to a vehicle sound effect generation apparatus that synthesizes a fundamental wave sound with a discordant adjustment wave sound, based on a risk degree of a vehicle.

BACKGROUND ART

In recent years, in-vehicle silencing is being dramatically promoted from viewpoints of both a car body structure and control. This causes a situation such that an engine sound cannot appropriately bring the realism of running.

Therefore, a sound effect (also referred to as an active engine sound) generation apparatus is proposed. The sound effect generation apparatus detects driver's driving amount and generates, in a vehicle, a sound effect of an engine according to the driving amount through an in-vehicle speaker.

A sound effect generation apparatus disclosed in Patent Literature 1 includes fundamental frequency setting means for setting a fundamental frequency related to the number of cylinders and a rotation speed of an engine, harmonic determining means for determining a plurality of harmonics of the fundamental frequency, and gain determining means for determining a harmonic-enhanced gain of the engine. The gain determining means includes a circuit that determines an engine load. The engine load determination circuit includes at least one of an accelerator pedal position determination circuit, a mass airflow determination circuit, a negative pressure determination circuit, and an engine torque determination circuit. The engine load determination circuit adjusts a harmonic enhancing level based on the harmonic-enhanced gain.

This configuration causes vehicle occupants including a driver to feel a startlingly realistic engine sound.

Further, a vehicle control device disclosed in Patent Literature 2 includes operation amount detecting means for detecting an operation amount of operation means to be operated during acceleration, transient operation amount arithmetic means for calculating a transient operation amount based on a stationary state of the operation means, speed arithmetic means for calculating an operating speed of the operation means, and target arithmetic means for calculating at least one of a target acceleration and a target sound pressure that increase by an increase exceeding a differential threshold per time when a human can perceive stimuli received. At least one of a torque generation device and an in-vehicle acoustic device is controlled based on at least one of the target acceleration and the target sound pressure.

This configuration offers comfortable acceleration performance and acceleration feeling to a driver.

Normally, a sound recognized by a person is an auditory phenomenon caused by a fluctuation (a sound wave) of an air pressure, and its property is roughly classified into three parts including a volume, a tone, and a timbre.

Herein, the volume is related to a sound pressure level, the tone is related to a frequency, and the timbre is related to a sound quality.

When a fundamental wave sound having a fundamental frequency component and an integer-order component wave sound having an integer-order (secondary or more) frequency component with respect to the fundamental wave sound are simultaneously generated, a concord in which both the sounds are mixed together is formed without a beat (interference) between the sounds because an integer-order adjustment wave sound (a component wave sound) of the integer-order frequency component is an overtone series of the fundamental wave sound.

On the contrary, when the fundamental wave sound and a component wave sound having a frequency component other than the integer-order (secondary or more) frequency component with respect to the fundamental wave sound are simultaneously generated, a discord (an unclear sound) is generated by the interference between the sounds because an adjustment wave sound to be synthesized with the fundamental wave sound is not an overtone series of the fundamental wave sound.

In the sound effect generation apparatus in Patent Literature 1, realism of an engine sound during actual running of a vehicle and characteristics of engine sounds that vary with vehicle types are artificially reproduced by setting a gain for enhancement per frequency component wave sound.

Further, in the vehicle control device in Patent Literature 2, a sound effect according to an increase in acceleration of a vehicle is generated by setting a target sound pressure level of a high-frequency component wave sound of an engine sound.

However, in the sound effect generation apparatuses in Patent Literature 1 and 2, an attention is not paid to properties of a sound effect to be generated in the viewpoint of driver's perception (sense), and thus relativity between a tone of a sound effect and running safety is not taken into consideration at all.

Normally, when a running state detecting sensor or the like determines a risk state of a vehicle, a drive assist device draws driver's attention through the lighting of a warning lamp or an alarm. The driver checks the running state of the vehicle and performs a predetermined driving operation to avoid the risk state.

When the warning lamp is used for notification, the driver turns an eye from the traveling frontal direction to the warning lamp, namely, the driver's attention drifts. For this reason, wariness persists in this case from a viewpoint of the running safety.

The use of the alarm can draw driver's attention in a state that the driver's gaze is maintained to the traveling frontal direction without shifting the driver's gaze.

However, the driver cannot recognize the alarm for the risk state earlier in some situations such that the driver listens to music at a high volume and talks with another vehicle occupant (passenger).

On the other hand, use of an alarm of a high sound pressure level might make another vehicle occupant uncomfortable or feel terror.

CITATION LIST

Patent Literature

Patent Literature 1: Japanese Translation of PCT Publication No. 2014-507679

Patent Literature 2: Unexamined Japanese Patent Publication No. 2008-025492

SUMMARY OF INVENTION

An object of the present invention is to provide a vehicle sound effect generation apparatus that can acoustically draw vehicle occupant's attention through an uncomfortable discord to heighten running safety.

The present invention for achieving the above object provides a vehicle sound effect generation apparatus for generating a sound effect of an engine based on a vibration sound database including a fundamental wave sound having a fundamental frequency component and a plurality of adjustment wave sounds having a frequency component other than the fundamental frequency component, the vehicle sound effect generation apparatus including a running state detecting unit that detects a running state of a vehicle, a risk degree determining unit that is capable of determining a risk degree of the vehicle based on the running state detected by the running state detecting unit, and a sound effect generation unit that, when the risk degree determining unit determines a risk degree which is a predetermined value or more, synthesizes the fundamental wave sound with one or more discordant adjustment wave sounds having a discordant frequency component other than an integer-order frequency component and a half-order frequency component.

The vehicle sound effect generation apparatus of the present invention can acoustically exhibit a risk degree through the uncomfortable discord of an engine to draw vehicle occupant's attention and thus to heighten running safety.

BRIEF DESCRIPTION OF DRAWINGS

FIG. 4A is a standard gain map; FIG. 4B is a decrease gain map; and FIG. 4C is an increase gain map.

DESCRIPTION OF EMBODIMENTS

Embodiments of the present invention will be described in detail below with reference to the drawings.

The following description illustrates that the present invention is applied to a vehicle V, and does not limit the present invention, its application, or its usefulness.

First Embodiment

A first embodiment of the present invention will be described below with reference to FIGS. 1 to 12.

A sound effect generation apparatus 1 selectively generates sound effects (a harmonic sound, a rumble sound, and a discord) of an engine in accordance with a running state of the vehicle V, and differently uses tones of the sound effects of the engine in accordance with the running state. As a result, the sound effect generation apparatus 1 provides current and future running information to a driver (a vehicle occupant) through an acoustic sense. In such a manner, an acoustic presentation effect during driving is heightened.

A sound effect presentation function provided by the sound effect generation apparatus 1 includes a realism enhancing function, a reminder function, and an operation uncomfortable feeling alleviating function.

Herein, the harmonic sound is a sound effect obtained by synthesizing a fundamental wave sound having a fundamental frequency component with an integer-order adjustment wave sound having an integer-order frequency component of the fundamental wave sound. The rumble sound is a sound effect obtained by synthesizing a fundamental wave sound having a fundamental frequency component with a half-order adjustment wave sound having a half-order frequency component of the fundamental wave sound. The discord is a sound effect obtained by synthesizing a fundamental wave sound having a fundamental frequency component with a discordant adjustment wave sound having a discordant frequency component other than the integer-order frequency component and the half-order frequency component of the fundamental wave sound. Further, in the following description, a primary frequency component is the fundamental frequency component, and a primary component wave sound having the primary frequency component is the fundamental wave sound.

Figure 1:
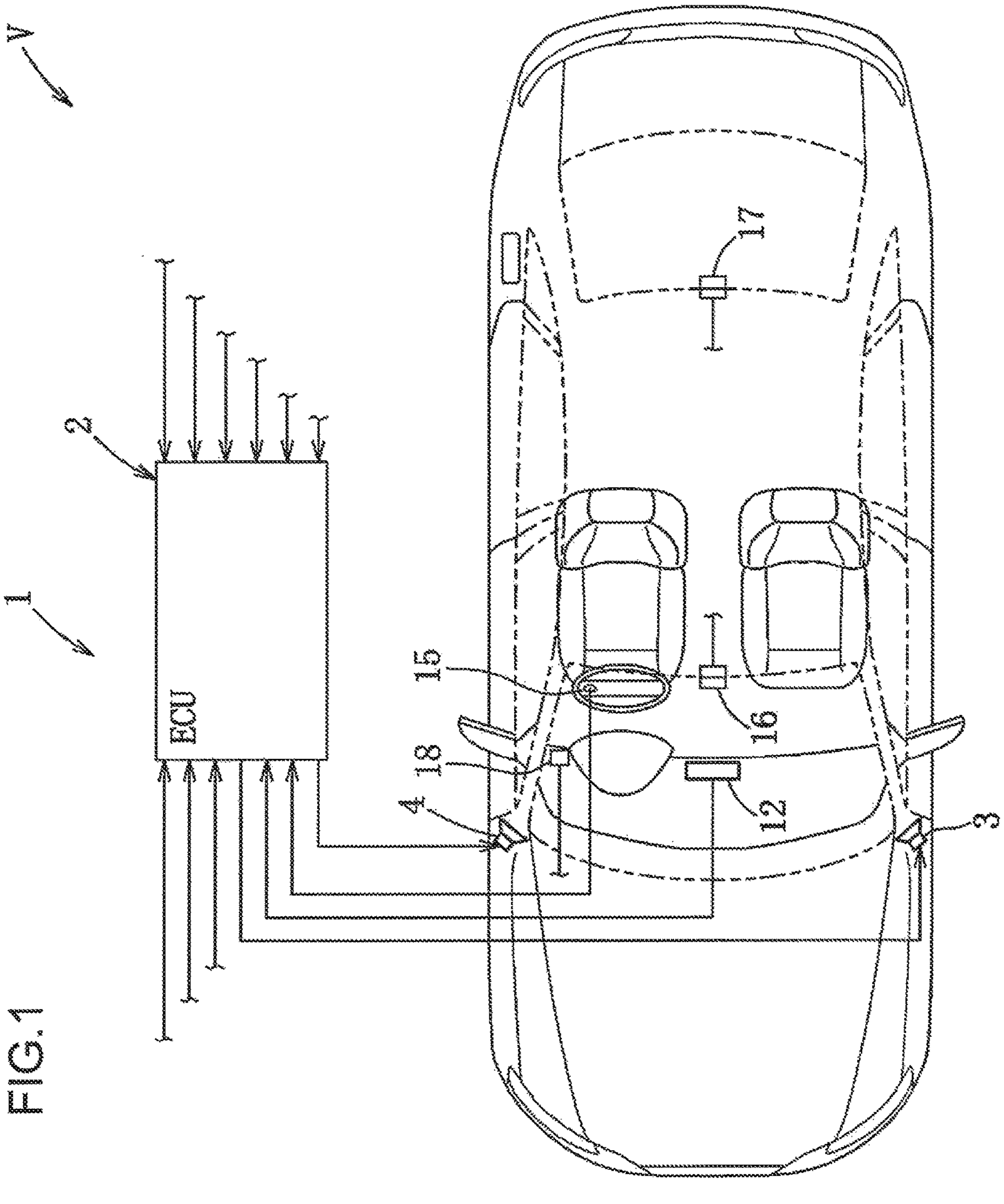
FIG. 1 is a schematic configuration diagram of a vehicle equipped with a vehicle sound effect generation apparatus according to a first embodiment.
Figure 2:
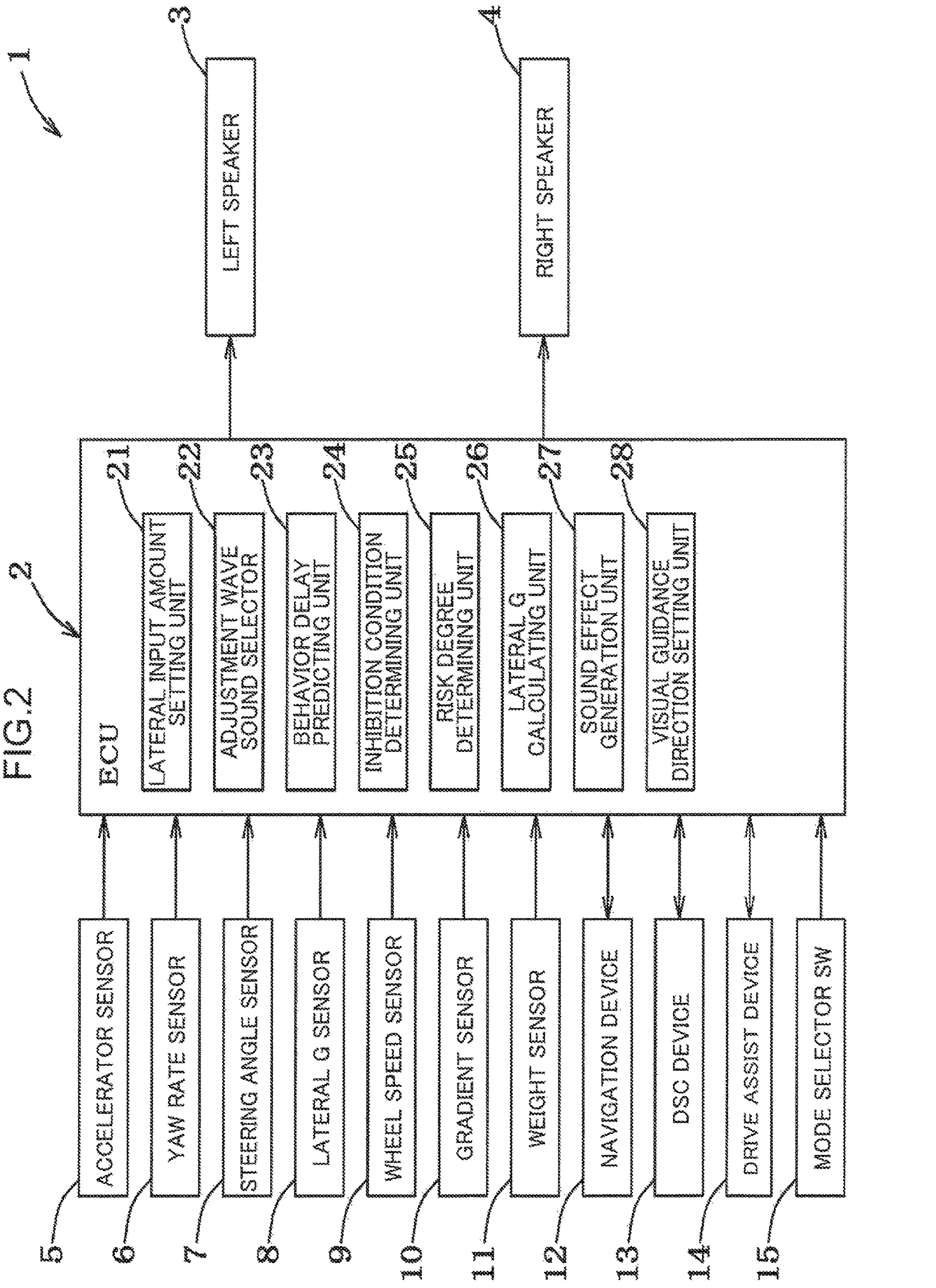
FIG. 2 is a block diagram of the vehicle sound effect generation apparatus.

As illustrated in FIGS. 1 and 2, the sound effect generation apparatus 1 includes an electric control unit (ECU) 2, a pair of right and left speakers 3 and 4 used as a part of an audio system, an accelerator sensor 5, a yaw rate sensor 6, a steering angle sensor 7, a lateral acceleration sensor (hereinafter, referred to as a lateral G sensor) 8, a wheel speed sensor 9, a gradient sensor 10, a weight sensor 11, a navigation device 12, a turn control device (hereinafter, referred to as a DSC device) 13, a drive assist device 14, a mode selector switch 15, and the like.

The pair of speakers 3 and 4 is connected so as to be capable of receiving an electric signal from the ECU 2. The respective sensors 5 to 11 and the mode selector switch 15 are connected so as to be capable of transmitting an electric signal to the ECU 2. The respective devices 12 to 14 are connected so as to be capable of transmitting and receiving an electric signal to and from the ECU 2. At least one of the respective sensors 5 to 11 and the respective devices 12 to 14 corresponds to a running state detecting unit that directly or indirectly detects a running state of the vehicle V including running environment information of the vehicle V.

The pair of speakers 3 and 4 and the respective sensors 5 to 11 will be first described.

The pair of speakers 3 and 4 is disposed on lower end portions of a pair of right and left front pillars, respectively, in accordance with a left front position and a right front position of a driver sat on a front seat.

The speakers 3 and 4 are configured to be capable of independently changing respective frequency gains and sound pressure levels of sounds (sound effects) generated by an operation signal input from the ECU 2.

For this reason, when a sound pressure level of a sound effect generated from the speaker 3 is set to be higher than a sound pressure level of a sound effect generated from the speaker 4, a driver's visual line is guided toward the speaker 3. Therefore, the driver can be caused to recognize a left front visual field including a left door mirror.

Further, when a sound pressure level of a sound effect generated from the speaker 4 is set to be higher than a sound pressure level of a sound effect generated from the speaker 3, a driver's visual line is guided toward the speaker 4. Therefore, the driver can be caused to recognize a right front visual field including a right door mirror.

The accelerator sensor 5 detects a pressing-down amount of an accelerator pedal (not illustrated) and outputs a detection signal. The yaw rate sensor 6 outputs a signal according to a yaw rate y of the vehicle V.

The steering angle sensor 7 outputs a signal relating to a steering angle θ of a steering wheel operated by a driver. The lateral G sensor 8 outputs a signal relating to a current lateral acceleration A which acts on the vehicle V. The wheel speed sensor 9 outputs a signal according to a rotation speed of wheels (not illustrated) for detection of a vehicle speed v. The gradient sensor 10 outputs a signal according to an inclination angle of a driving lane (road surface) on which the vehicle V currently runs or stops. The weight sensor 11 outputs a signal relating to a weight of a load in a trunk of the vehicle V The respective devices 12 to 14 will be described below.

As illustrated in FIGS. 1 and 2, the navigation device 12 is disposed on an upper center of an instrument panel, and includes a position detector for the vehicle V, a map data input unit, a sound output speaker, a monitor, and the like (they are not illustrated). The navigation device 12 is electrically connected with a global positioning system (GPS) receiver (not illustrated) for detecting a current running position of the vehicle V.

The GPS receiver receives signals from a plurality of GPS satellites to detect a current position of the vehicle V.

Further, the navigation device 12 includes a map database in which road map data is stored, traffic rules database in which traffic rules data is stored, and the like (these databases are not illustrated).

As a result, the navigation device 12 gives a driver a route to driver's destination using the current position data of the vehicle V through the GPS receiver, the road map data in the map database, and the traffic rules data in the traffic rules database. The navigation device 12 outputs the current position data of the vehicle V, the road map data, and the traffic rules data to the ECU 2.

The navigation device 12 corresponds to a turn information acquisition unit that acquires curvature information including an existence position and a turning radius of a curve on a driving lane in a traveling frontal direction of the vehicle V from the map database.

The DSC device 13 receives input signals from the respective sensors to perform DSC control to improve running stability of the vehicle V during turn.

Specifically, when determining, based on detection signals from the yaw rate sensor 6, the lateral G sensor 8, and the wheel speed sensor 9, that a turning attitude of the vehicle V is lost by a predetermined amount or more, the DSC device 13 controls braking forces of the respective wheels through an operation of a pressurizing unit (not illustrated) for a brake fluid pressure, and causes a yaw moment to act on a vehicle body so as to turn the turning attitude of the vehicle V in a target direction.

Further, the DSC device 13 receives the input signals from the respective sensors, and performs antilock brake system (ABS) control to prevent wheel locks of the respective wheels.

Specifically, the DSC device 13 calculates slip ratios of the respective wheels based on a detection signal from the wheel speed sensor 9, and when detecting a wheel whose calculated slip ratio exceeds a predetermined threshold, controls the pressurizing unit to reduce the braking force acting on the wheel detected. In such a manner, the wheel lock is prevented.

The DSC device 13 calculates, based on a detection signal from the lateral G sensor 8 and a detection signal from the wheel speed sensor 9, a road surface friction coefficient μ (hereinafter, simply the friction coefficient μ) as well as the slip ratios of the wheels, and outputs the calculated friction coefficient μ to the ECU 2.

The drive assist device 14 has an inter-vehicle distance notifying function of notifying an inter-vehicle distance in front of and behind the vehicle V, a feeling improving function of improving driver's feeling, and the like.

The inter-vehicle distance notifying function is a function of avoiding collision by sounding an alarm via the speakers 3 and 4 or lighting a warning lamp (not illustrated) so as to cause a driver to recognize a risk of collision when another vehicle (a leading vehicle or a following vehicle) or an obstacle is present in a region which is separated from the vehicle V by a predetermined distance in front of and behind the vehicle V during running, and by guiding the driver to perform an avoiding operation.

The feeling improving function is a function of estimating a feeling relating to driver's emotions during running, based on driver's facial expression and action, and guiding a driver's feeling to an improved zone (from an uncomfortable or inactive state to a comfortable or active state) through lighting and music.

As illustrated in FIG. 1, the drive assist device 14 includes charge coupled device (CCD) cameras 16 to 18 that can capture a still image or a moving image.

The front camera 16 is attached to a position near a rear-view mirror (not illustrated) on a front-end lower surface of a roof panel, and is configured to be capable of imaging a white line position of a driving lane in a traveling frontal direction, a leading vehicle, approach and parting positions of a curve in the traveling frontal direction, and the like, via a front windshield glass.

The rear camera 17 is attached to a rear-end lower surface of the roof panel, and is configured to be capable of imaging a following vehicle and the like via a rear windshield glass. The cameras 16 and 17 are a stereo type camera in which a lens mechanism and a shutter mechanism are shared by the two cameras, and are configured to be capable of individually detecting a distance between the vehicle V and an object to be imaged and a direction from the vehicle V to the object to be imaged.

The indoor camera 18 is attached, for example, to above the instrument panel to image an upper body of the driver including a driver's face. The captured image of the upper body of the driver is used for: specifying a facial expression by cutting out the facial image from the captured image; specifying a dimension of pupils and an eye direction by enlarging and detecting irises of eyes; and specifying an attitude based on a barycentric position of the image and a shape of the upper body, for example. A driver's emotion is estimated by using a biaxial plane formed by a transverse axis expressing comfort and discomfort and a vertical axis expressing activeness and inactiveness (for example, a Russell's circumplex model of emotions) and a feature amount of a driver's facial expression imaged by the indoor camera 18.

Further, the indoor camera 18 can capture an indoor image including a vehicle occupant (passenger) other than the driver at a wide angle, and detects the number of vehicle occupants in the vehicle V through this captured image.

The mode selector switch 15 includes a momentary selector switch with which activation (starting of an operation) of the sound effect generation apparatus 1 and a type (a mode) of a sound effect can be selected.

The mode selector switch 15 is configured to be capable of selecting a first mode for generating an engine sound effect mainly including a harmonic sound through a predetermined ON operation, or a second mode for generating an engine sound effect mainly including a rumble sound through a predetermined ON operation.

All frequencies of component sounds match with each other and a beat (interference) does not occur between a fundamental wave sound and an integer-order adjustment wave sound having an integer-order frequency component. For this reason, a harmonic sound, which is obtained by synthesizing the fundamental wave sound with one or more integer-order adjustment wave sounds, reverberates, and a concord that makes a driver comfortable is generated.

Interference partially occurs between a fundamental wave sound and a half-order adjustment wave sound, in which an even-number-order overtone includes a half-order frequency component which is an overtone series of the fundamental wave sound. However, since a driver (a vehicle occupant) feels such interference only slightly, a rumble sound, which is obtained by synthesizing the fundamental wave sound with one or more half-order adjustment wave sounds, is rather dynamic. Thus, a quasi-concord that causes the vehicle occupants such as the driver to recognize feeling of power is generated.

Further, when any one of the first and second modes is selected in an ON state of the mode selector switch 15, a third mode for generating an engine sound effect mainly including a discord is executed under a condition that a risk degree B determined by a risk degree determining unit 25, described later, is a determination threshold r1 or more for determining the risk degree.

The sound effect to be generated in the third mode is obtained by synthesizing a fundamental wave sound having a fundamental frequency component with one or more discordant adjustment wave sounds having a discordant frequency component other than an integer-order frequency component and a half-order frequency component of the fundamental wave sound. For this reason, a beat occurs between component sounds. Thus, this sound effect is a discord that gives the driver an uncomfortable impression accompanied by nervousness and a sense of caution.

The ECU 2 will be described below.

The ECU 2 is configured to synthesize a fundamental wave sound with the selected one or more adjustment wave sounds to artificially generate an engine sound effect so as to improve a driver's operational feeling.

The ECU 2 includes a central processing unit (CPU), a read-only memory (ROM), a random-access memory (RAM), an amplifier, an in-side interface, and an out-side interface.

The ROM stores various programs and data for generating respective engine sound effects, and the RAM is provided with a processing area to be used when the CPU executes a series of process.

The in-side interface is electrically connected to the respective sensors 5 to 11, the respective devices 12 to 14, and the mode selector switch 15. The out-side interface is electrically connected to the pair of speakers 3 and 4 and the respective devices 12 to 14 via the amplifier.

The ECU 2 stores a vibration sound map M1 (a vibration sound database) in which a plurality of sound sources is stored, the sound sources being preset so as to be fitted to generated sounds from a four-cylinder gasoline engine mounted to the vehicle V.

Figure 3:
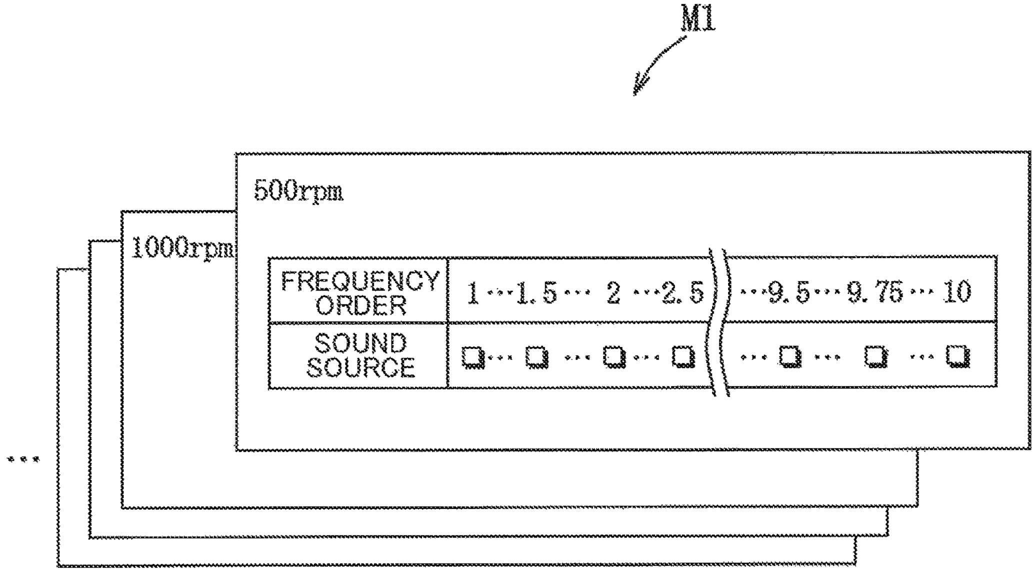
FIG. 3 is a vibration sound map.

As illustrated in FIG. 3, the vibration sound map M1 stores, per rotation speed of an engine, sound sources at each unit frequency (for example, 0.01-order frequency) from a primary component wave sound (a fundamental wave sound) to 10-order component wave sound, the primary component wave sound having a fundamental frequency component, the 10-order component wave sound having a frequency component which is ten times as large as the fundamental frequency component.

For this reason, the vibration sound map M1 includes, per rotation speed of an engine, a fundamental wave sound, an integer-order component wave sound (an integer-order adjustment wave sound) having a frequency component which is an integral multiple of a fundamental frequency component, a half-order component wave sound (a half-order adjustment wave sound) in which an even-number-order overtone is an overtone series of the fundamental wave sound, and a discordant component wave sound (a discordant adjustment wave sound) in which an overtone relationship does not hold with respect to the fundamental wave sound.

As illustrated in FIG. 2, the ECU 2 includes a lateral input amount setting unit 21, an adjustment wave sound selector 22, a behavior delay predicting unit 23, an inhibition condition determining unit 24, a risk degree determining unit 25, a lateral G calculating unit 26 (a lateral acceleration calculating unit), a sound effect generation unit 27, and a visual guidance direction setting unit 28.

The lateral input amount setting unit 21 is configured to be capable of setting a lateral input amount P in which a physical amount relating to at least one of a movement of the vehicle V in a width direction and a movement of the vehicle V in the turning direction is a parameter, based on a running state of the vehicle V detected by a running state detecting unit (at least one of the respective sensors 5 to 11 and the respective devices 12 to 14).

When a detection value of a yaw rate is set to y and a detection value of the lateral acceleration is set to A, in a case where the vehicle speed v of the vehicle V is a determination threshold t2 or more, the lateral input amount P is calculated in accordance with a following equation (1).

$$P=y/A \tag{1}$$

As a result, the lateral input amount P in which a sideslip tendency and a slip tendency of the vehicle V are reflected is obtained.

When the vehicle speed v of the vehicle V is less than the determination threshold t2, the lateral input amount setting unit 21 sets the lateral input amount P to the lateral acceleration A. When the vehicle speed v is low like a time of turning right or left at an intersection, since sideslip or slip of the vehicle V hardly occurs, the lateral acceleration A in which an actual turning state of the vehicle V is reflected most clearly is used as the lateral input amount P.

At least a vehicle state in a lateral direction may be reflected in the lateral input amount P. Like the lateral input amount P at the low-vehicle speed, any one detection value of the steering angle θ of the steering wheel, the yaw rate y, and the lateral acceleration A may be used as the lateral input amount P regardless of the vehicle speed v. Further, a parameter in which two or more detection values are combined can be adopted as the lateral input amount P regardless of the vehicle speed v.

The adjustment wave sound selector 22 will be described below.

The adjustment wave sound selector 22 is configured to be capable of selecting, from the plurality of component wave sounds stored in the vibration sound map M1, one or more adjustment wave sounds to be synthesized with a fundamental wave sound N0.

The adjustment wave sound selector 22 selects first to third adjustment wave sounds N1 to N3, and determines, using the gain maps M2 to M4 selected based on a running state, first to third gains g1 to g3 (0<g1<g2<g3) for correcting the first to third adjustment wave sounds N1 to N3, respectively.

The gain maps M2 to M4 will be described.

Figure 4A:
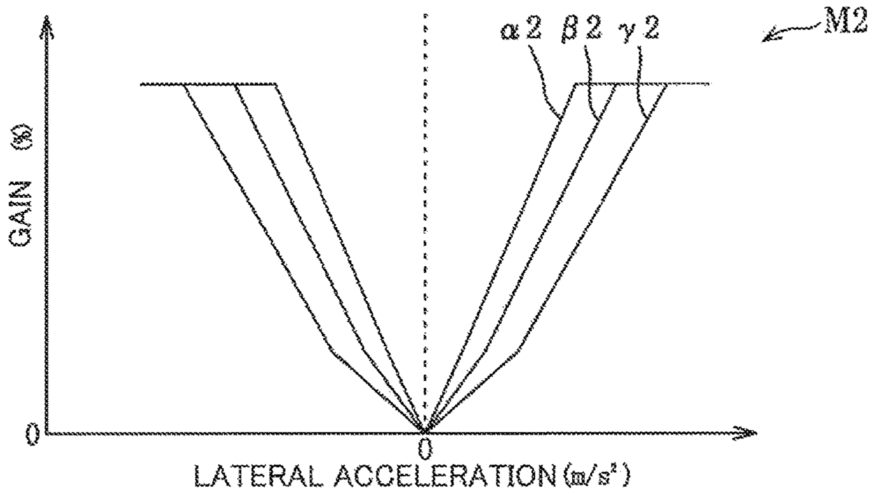
FIG. 4A to FIG. 4C illustrate gain maps of adjustment wave sounds set in accordance with a lateral acceleration.
Figure 4B:
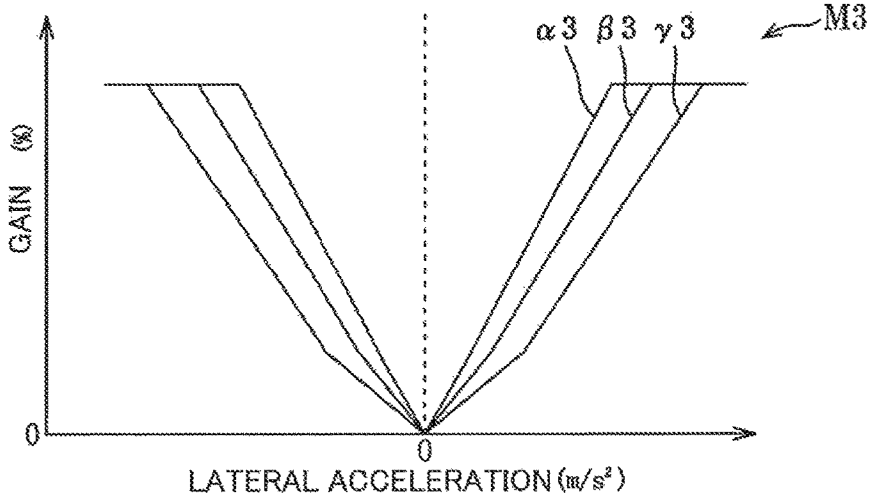
Figure 4C:
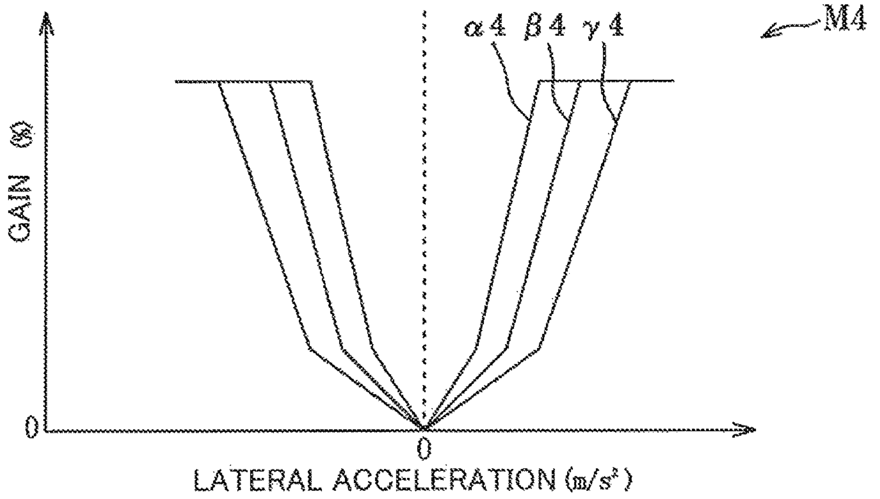

As illustrated in FIG. 4A to FIG. 4C, the ECU 2 stores a standard gain map M2, a decrease gain map M3, an increase gain map M4 in advance.

Gains $\alpha 2$ to $\alpha 4$, $\beta 2$ to $\beta 4$, and $\gamma 2$ to $\gamma 4$ of the first to third adjustment wave sounds N1 to N3 as one of output properties of a sound effect are set symmetrically so as to be defined to zero when the lateral acceleration A is zero and so as to be increased like a linear function as an absolute value of the lateral acceleration A increases.

The gains $\alpha 2$ to $\alpha 4$, $\beta 2$ to $\beta 4$, and $\gamma 2$ to $\gamma 4$ increase at an increase rate which is larger than an increase rate before a certain mid-stage point and are converged to a constant value at an upper limit value.

In the gain maps M2 to M4, the gain values are defined such that a following formula (2) holds.

$$\gamma 2<\beta 2<\alpha 2$$

$$\gamma 3<\beta 3<\alpha 3$$

$$\gamma 4<\beta 4<\alpha 4 \quad (2)$$

Further, in the gain maps M2 to M4, the gain values are defined respectively such that a following formula (3) holds.

$$\alpha 3<\alpha 2<\alpha 4$$

$$\beta 3<\beta 2<\beta 4$$

$$\gamma 3<\gamma 2<\gamma 4 \quad (3)$$

The adjustment wave sound selector 22 selects the gain maps M2 to M4 using, as determination conditions, a predicted result of the behavior delay predicting unit 23 and a determined result of the inhibition condition determining unit 24.

The behavior delay predicting unit 23 is configured to predict that a behavior delay of the vehicle V occurs when a total weight of the vehicle V to be specified by the number of vehicle occupants and a weight of a cargo (hereinafter, simply a vehicle weight) is a determination threshold t3 or more.

When the behavior delay predicting unit 23 predicts occurrence of the behavior delay of the vehicle V in such a manner, the adjustment wave sound selector 22 selects the increase gain map M4 having high responsivity.

That is, when the vehicle weight is the determination threshold t3 or more, the behavior of the vehicle V is likely to be delayed with respect to a steering angle operation (an operation amount) performed by the driver. For this reason, the adjustment wave sound selector 22 selects the increase gain map M4 having high responsivity such that a sound effect is corrected to be increased prior to a current behavior of the vehicle V. As a result, the behavior delay of the vehicle V is corrected acoustically so that a driver's feeling of strangeness in the operation can be eliminated.

The inhibition condition determining unit 24 is configured to determine that the vehicle V is in a condition that association between a driver's operation amount and the behavior of the vehicle V is inhibited, in other words, operability of the vehicle V is deteriorated (hereinafter, in the inhibition condition), when the friction coefficient $\mu$ is a determination threshold t4 or less or when an ascending gradient is a determination threshold t5 or more.

When the inhibition condition determining unit 24 determines the inhibition condition such that the operability of the vehicle V is deteriorated, the adjustment wave sound selector 22 selects the decrease gain map M3 having low responsivity.

That is, when the friction coefficient $\mu$ input from the DSC device 13 is the determination threshold t4 or less or when an ascending gradient input from the gradient sensor 10 is the determination threshold t5 or more, an actual behavior of the vehicle V can hardly follow a steering angle operation performed by the driver. For this reason, the adjustment wave sound selector 22 selects the decrease gain map M3 having low responsivity such that the sound effect is corrected to be decreased. As a result, degradation of the following performance of the vehicle V is corrected acoustically so that a driver's feeling of strangeness in the operation can be eliminated.

On the other hand, when a behavior delay of the vehicle V and the degradation of the following performance are unlikely to occur, the standard gain map M2 having standard responsivity is selected.

Further, description returns to the adjustment wave sound selector 22.

When the first mode is selected, the adjustment wave sound selector 22 is configured to select, based on the lateral input amount P, the first to third adjustment wave sounds N1 to N3 having an integer-order frequency component.

Specifically, when the lateral input amount P is a determination threshold p2 or less (0<p1<p2), a secondary component wave sound which is an integer-order frequency component closest to a fundamental frequency component is allocated to the first adjustment wave sound N1. When the lateral input amount P is larger than the determination threshold p2 and is a determination threshold p3 or less (p2<p3), a tertiary component wave sound which is an integer-order frequency component next closest after the secondary component wave sound is allocated to the second adjustment wave sound N2 as well as the already selected first adjustment wave sound N1. When the lateral input amount P is larger than the determination threshold p3, a quaternary component wave sound which is an integer-order frequency component next closest after the tertiary component wave sound is allocated to the third adjustment wave sound N3 as well as the already selected first and second adjustment wave sounds N1 and N2.

The reason for such an operation is that a consonance level of an adjustment wave sound having an integer-order frequency component can be made to be higher as the integer-order frequency component is closer to the fundamental frequency component.

The adjustment wave sound selector 22 extracts, based on the lateral input amount P, the gain g1 ($\alpha 2$ to $\alpha 4$) for correcting the first adjustment wave sound N1, the gain g2 ($\beta 2$ to $\beta 4$) for correcting the second adjustment wave sound N2, and the gain g3 ($\gamma 2$ to $\gamma 4$) for correcting the third adjustment wave sound N3 from any one of the selected gain maps M2 to M4. As described above, when the first mode is selected, as the lateral input amount P is larger, the adjustment wave sound selector 22 increases the number of the first to third adjustment wave sounds N1 to N3 and increases the first to third gains g1 to g3 of the selected first to third adjustment wave sounds N1 to N3.

The adjustment wave sound selector 22 is configured to select, based on the lateral input amount P, the first to third adjustment wave sounds N1 to N3 having a half-order frequency component when the second mode is selected.

Specifically, when the lateral input amount P is the determination threshold p2 or less, a 1.5-order component wave sound which is a half-order frequency component closest to a fundamental frequency component is allocated to the first adjustment wave sound N1. When the lateral input amount P is larger than the determination threshold p2 and is the determination threshold p3 or less, a 2.5-order component wave sound which is a half-order frequency component next closest after the 1.5-order component wave sound is allocated to the second adjustment wave sound N2 as well as the already selected first adjustment wave sound N1. When the lateral input amount P is larger than the determination threshold p3, a 3.5-order component wave sound which is a half-order frequency component next closest after the 2.5-order component wave sound is allocated to the third adjustment wave sound N3 as well as the already selected first and second adjustment wave sounds N1 and N2.

The reason for such an operation is that a consonance level (a quasi-concordant level) of an adjustment wave sound having a half-order frequency component can be made to be higher as the half-order frequency component is closer to the fundamental frequency component.

Similarly to the first mode, the adjustment wave sound selector 22 extracts, based on the lateral input amount P, the gain g1 for correcting the first adjustment wave sound N1, the gain g2 for correcting the second adjustment wave sound N2, and the gain g3 for correcting the third adjustment wave sound N3 from any one of the selected gain maps M2 to M4. As described above, when the second mode is selected, as the lateral input amount P is larger, the adjustment wave sound selector 22 increases the number of the first to third adjustment wave sounds N1 to N3 and increases the first to third gains g1 to g3 of the selected first to third adjustment wave sounds N1 to N3.

The adjustment wave sound selector 22 is configured to select, based on the risk degree B, the first to third adjustment wave sounds N1 to N3 having a discordant frequency component when the third mode is selected in accordance with the determination in the risk degree determining unit 25.

The risk degree determining unit 25 determines the risk degree B of the vehicle V based on a current running state.

The risk degree determining unit 25 calculates determination amounts a to c based on a steering angle speed Δθ in a driver's steering operation, the lateral input amount P, and an inter-vehicle distance L between the vehicle V and a leading vehicle or a following vehicle closest to the vehicle V, and calculates the risk degree B based on the calculated determination amounts a to c.

When the steering angle speed Δθ is a determination threshold t6 or more, the steering angle speed determination amount a is calculated in accordance with a following formula (4). When the steering angle speed Δθ has the other values, the amount a is zero. Symbols k1 to k3 (0<k1, k2, k3) represent correction coefficients.

$$a=k1\times\Delta\theta \tag{4}$$

When the lateral input amount P is a determination threshold t7 or less, the lateral input amount determination amount b is calculated in accordance with a following formula (5). When the lateral input amount P has the other values, the amount b is zero.

$$b=k2\times P \tag{5}$$

When the inter-vehicle distance L is a determination threshold t8 or less, the inter-vehicle distance determination amount c is calculated in accordance with a following formula (6). When the inter-vehicle distance L has the other values, the amount c is zero.

$$c=k3\times L \tag{6}$$

The risk degree B is calculated in accordance with a following formula (7).

$$B=a+b+c \tag{7}$$

As a result, when each of the determination amounts is averagely high and also when a specific determination amount is high, the risk degree B is determined accurately.

When the risk degree B determined by the risk degree determining unit 25 is the determination threshold r1 or more (0<r1) in a state that either of the first and second modes is selected, the adjustment wave sound selector 22 determines that the third mode is selected and selects the first to third adjustment wave sounds N1 to N3 based on the risk degree B.

Specifically, when the risk degree B is a determination threshold r2 or less (r1<r2), a 9.75-order component sound wave is allocated to the first adjustment wave sound N1, the 9.75-order component sound wave being a discordant frequency component which is farthest from the fundamental frequency component and is in a middle section between an integer-order frequency component (a ten-order frequency component) and a half-order frequency component (a 9.5-order frequency component). When the risk degree B is larger than the determination threshold r2 and is a determination threshold r3 or less (r2<r3), a 9.25-order component sound wave is allocated to the second adjustment wave sound N2 as well as the already selected first adjustment wave sound N1, the 9.25-order component sound wave being a discordant frequency component which is next farthest from the fundamental frequency component after the 9.75-order component sound wave and is in a middle section between an integer-order frequency component (a 9-order frequency component) and the half-order frequency component (the 9.5-order frequency component). When the risk degree B is larger than the determination threshold r3, a 8.75-order component wave sound is allocated to the third adjustment wave sound N3 as well as the already selected first and second adjustment wave sounds N1 and N2, the 8.75-order component wave sound being a discordant frequency component which is next farthest from fundamental frequency after the 9.25-order component sound wave and is in a middle section between the integer-order frequency component (the 9-order frequency component) and a half-order frequency component (a 8.5-order frequency component).

The reason for such an operation is that interference increases (is amplified) and a discordant level can be made to be higher in the adjustment wave sound having the discordant frequency component as the discordant frequency component is farther from the fundamental frequency component and is farther from an integer-order frequency component and a half-order frequency component.

Similarly to the first and second modes, the adjustment wave sound selector 22 extracts, based on the lateral input amount P, the gain g1 for correcting the first adjustment wave sound N1, the gain g2 for correcting the second adjustment wave sound N2, and the gain g3 for correcting the third adjustment wave sound N3 from any one of the selected gain maps M2 to M4, and corrects the first to third adjustment wave sounds N1 to N3.

As described above, when the third mode is selected, as the risk degree B is larger, the adjustment wave sound selector 22 increases the number of the first to third adjustment wave sounds N1 to N3 to be selected and increases the first to third gains g1 to g3 of the selected first to third adjustment wave sounds N1 to N3.

When the prediction lateral acceleration A1 calculated by the lateral G calculating unit 25 is a determination threshold t1 or more, the adjustment wave sound selector 22 selects the first to third adjustment wave sounds N1 to N3, and determines, using the gain maps M2 to M4 selected based on the running state, the first to third gains g1 to g3 for respectively correcting the first to third adjustment wave sounds N1 to N3.

The lateral G calculating unit 26 is configured to determine, based on map information including a turning radius input from the map database of the navigation device 12, whether a curve is present in the traveling frontal direction of the vehicle V, and to calculate, when the curve is present, the prediction lateral acceleration A1, which acts on the vehicle V going around the curve.

The prediction lateral acceleration A1 is calculated under a condition that a curve is present at a distance which has been preset so as to be separated from a current running position of the vehicle V or in an area where the vehicle V has been predicted to arrive within a preset time.

A turning angle θt of the wheels can be calculated in accordance with a following formula (8) when a prediction steering angle of the vehicle V according to the turning radius of the curve is represented by θp and a gear ratio of the vehicle V is represented by gr.

$$\theta t=\theta p/gr \tag{8}$$

Further, a front wheel position rotating radius R of the vehicle V can be calculated in accordance with a following formula (9) when a wheel base of the vehicle V is represented by W.

$$R=W/\sin\theta t \tag{9}$$

When a vehicle speed is represented by v, the prediction lateral acceleration A1 can be expressed by a following formula (10). For this reason, the prediction lateral acceleration A1, which acts on the vehicle V in going around the curve where the vehicle V runs in the near future, can be obtained by assigning the front wheel position rotating radius R calculated in accordance with the formula (9) to the formula (10).

$$A1=v^2/R \tag{10}$$

The sound effect generation unit 27 will be described below.

The sound effect generation unit 27 is configured to correct, as expressed in a following formula (11), the first to third adjustment wave sounds N1 to N3 using the first to third gains g1 to g3 extracted for each mode, and synthesize the fundamental wave sound N0 with the first to third adjustment wave sounds N1 to N3 corrected after selection to generate a sound effect S.

$$N1\leftarrow g1\times N1$$

$$N2\leftarrow g2\times N2$$

$$N3\leftarrow g3\times N3 \tag{11}$$

Further, the sound effect generation unit 27 increases a sound pressure level of the sound effect S as the lateral input amount P is larger, the risk degree B is larger, and the prediction lateral acceleration A1 is larger.

As a result, the driver is caused to acoustically recognize levels of the lateral input amount P, the risk degree B, and the prediction lateral acceleration A1 which affect running of the vehicle V.

The sound effect generation unit 27 is configured to be capable of setting the sound pressure level correction coefficients $G_L$ and $G_R$ of the pair of speakers 3 and 4 and changing the sound pressure levels of the sound effects independently.

The sound effect generation unit 27 increases a sound pressure level of the speaker 3 (4) on a side of the visual guidance direction, the sound pressure level being set by the visual guidance direction setting unit 28, and decreases a sound pressure level of the other speaker 4 (3) with respect to a visual guidance direction θd.

When the visual line of the driver is guided, a strength ratio between the sound pressure level correction coefficients $G_L$ and $G_R$ is changed by setting the sound pressure level correction coefficients $G_L$ and $G_R$ for correction coefficients k4 and k5, respectively, and a localized horizontal direction of a sound image with respect to a frontal direction of the driver is changed.

The correction coefficients k4 and k5 are obtained as interpolation coefficients to be set based on the visual guidance direction θd.

The visual guidance direction setting unit 28 is configured to determine presence or absence of a visual guidance request based on various information from the navigation device 12 and the drive assist device 14, and be capable of setting, when the visual guidance request is present, the visual guidance direction θd at which the driver shoots a look in a frontal direction of the driver.

A subject at which the driver has to look is a subject that possibly affects running of the vehicle V from a viewpoint of safety and operability when the driver does not recognize the subject. The visual guidance direction θd is defined as a direction where the driver can recognize a subject at which the driver has to look with the driver as a reference.

Specifically, in a situation that a following vehicle overtakes the vehicle V (or a vehicle that is running on a right lane is approaching rapidly), the following vehicle passes by on a right side of the vehicle V. For this reason, when the vehicle V makes a lane change to the right lane, the vehicles might get contact with each other. Therefore, when the drive assist device 14 detects rapid approach of a following vehicle (a vehicle that is running on a right lane), the visual guidance direction setting unit 28 determines presence of the visual guidance request to guide the driver's visual line to a right door mirror. For this reason, the visual guidance direction θd associated with a right forward direction is set, and sound images from the speakers 3 and 4 are localized in the visual guidance direction θd.

Further, in a situation that the driver is following a curve, when a driver's visual line is not fixed to a parting position (or a clipping point) of the curve, the driver might lose control of the vehicle. Therefore, when the drive assist device 14 (the navigation device 12) detects a curve parting position during running, the visual guidance direction setting unit 28 determines presence of the visual guidance request, and sets the visual guidance direction θd associated with a curve parting position to localize sound images from the speakers 3 and 4 in the visual guidance direction θd.

In a situation that the driver is tired during running on a freeway, the driver might lose control of the vehicle. Therefore, when the drive assist device 14 detects a driver's fatigue (for example, uncomfortable and inactive) state, the visual guidance direction setting unit 28 determines presence of the visual guidance request, and sets the visual guidance direction θd associated with a rest area (or an overhead sign) based on the map information in the navigation device 12 to localize the sound images from the speakers 3 and 4 in the visual guidance direction θd.

A procedure of a sound effect generating process will be described below with reference to flowcharts of FIGS. 5 to 12. In FIGS. 5 to 12, Si (i=1, 2 . . . ) represents a step of each process.

Figure 5:
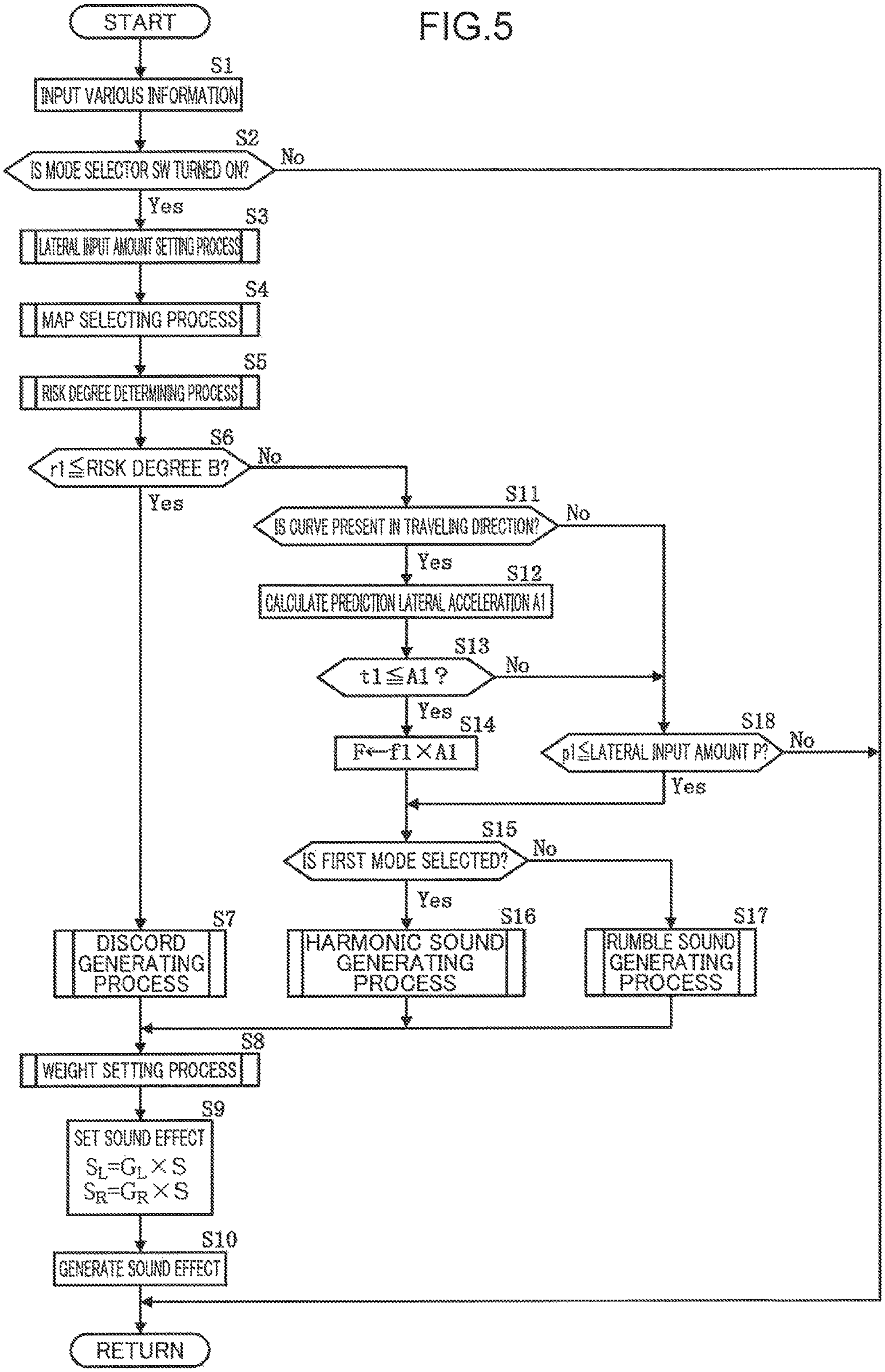
FIG. 5 is a flowchart of a sound effect generating process.

As illustrated in the flowchart of FIG. 5, in the sound effect generating process, first, in S1 various information such as detection values of the respective sensors and determination thresholds is read, and the first to third adjustment wave sounds N1 to N3, the gains g1 to g3, a sound pressure level correction coefficient F, the sound pressure level correction coefficients $G_L$ and $G_R$, and the determination amounts a to c which are set in the previous routine are initialized, and the process goes to S2.

In S2, a determination is made whether the mode selector switch 15 has performed an ON operation.

As a result of the determination in S2, when the mode selector switch 15 has performed the ON operation, the process goes to S3 and a lateral input amount setting process is executed. As the result of the determination in S2, when the mode selector switch 15 has not performed the ON operation, the sound effect generating process is not executed, and the process returns.

After a map selecting process (S4) is executed, the process goes to S5 and a risk degree determining process is executed.

In S6, a determination is made whether the risk degree B is the determination threshold r1 or more.

As a result of the determination in S6, when the risk degree B is the determination threshold r1 or more, the third mode is executed more preferentially than the first and second modes. The process then goes to S7 and a discord generating process is executed.

The process goes to S8 and a weight setting process is executed.

The process then goes to S9. A signal of the left sound effect $S_L$ is set by multiplying the sound effect S and the sound pressure level correction coefficient $G_L$, and a signal of the right sound effect $S_R$ is set by multiplying the sound effect S and the sound pressure level correction coefficient $G_R$.

The process then goes to S10. The control signals of the sound effect $S_L$ and $S_R$ are output to the speakers 3 and 4, respectively, and after the sound effects $S_L$ and $S_R$ are generated from the speakers 3 and 4, respectively, the process returns.

As the result of the determination in S6, when the risk degree B is less than the determination threshold r1, the process goes to S11, and a determination is made whether a curve is present in the traveling frontal direction of the vehicle V.

As a result of the determination in S11, when a curve is present in the traveling frontal direction of the vehicle V, the process goes to S12, and the prediction lateral acceleration A1 is calculated by using formulas (8) to (10).

In S13, a determination is made whether the prediction lateral acceleration A1 is the determination threshold t1 or more.

As a result of the determination in S13, when the prediction lateral acceleration A1 is the determination threshold t1 or more, a careful driving operation is necessary for running on a curve where the vehicle V enters in the near future, and an alert has to be raised such that driver's attention is turned to the driving operation. For this reason, the process goes to S14, and a multiplied value of the prediction lateral acceleration A1 by correction coefficient f1 is set as the sound pressure level correction coefficient F.

In S15, a determination is made whether the first mode has been selected by an operation of the mode selector switch 15.

As a result of the determination in S15, when the first mode has been selected, the process goes to S16. After the harmonic sound generating process is executed, the process goes to S8.

As the result of the determination in S15, when the first mode has not been selected, the second mode is selected. For this reason, the process goes to S17, and after the rumble sound generating process is executed, the process goes to S8.

As the result of the determination in S13, when the prediction lateral acceleration A1 is less than the determination threshold t1, the prediction lateral acceleration A1 to be generated in the future is small, and the need to raise an alert for the driver is low. For this reason, the process goes to S18, and a determination is made whether the current lateral input amount P is a determination threshold p1 or more.

As a result of the determination in S18, when the lateral input amount P is the determination threshold p1 or more, the lateral input amount P that affects a behavior of the vehicle V is generated. Therefore, process goes to S15.

As the result of the determination in S18, when the lateral input amount P is less than the determination threshold p1, the lateral input amount P that affects a behavior of the vehicle V is not generated. Therefore, process returns.

A procedure of the lateral input amount setting process will be described below.

Figure 6:
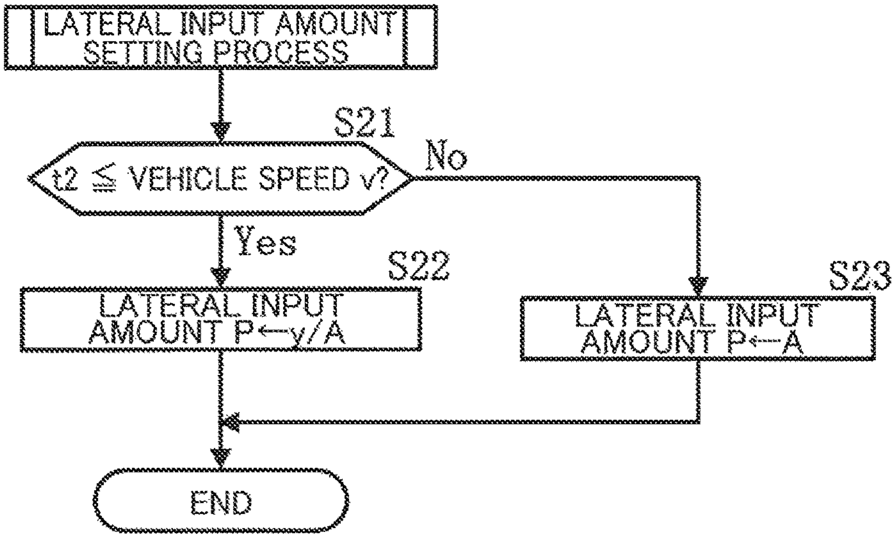
FIG. 6 is a flowchart of a lateral input amount setting process.

As illustrated in the flowchart of FIG. 6, in the lateral input amount setting process, first, a determination is made in S21 whether the vehicle speed v is the determination threshold t2 or more.

As a result of the determination in S21, when the vehicle speed v is the determination threshold t2 or more, the process goes to S22, and a value obtained by dividing the yaw rate y by the lateral acceleration A is set as the lateral input amount P. The process then ends.

As the result of the determination in S21, when the vehicle speed v is less than the determination threshold t2, the process goes to S23, and the lateral acceleration A is set as the lateral input amount P. The process then ends.

A procedure of the map selecting process will be described below.

Figure 7:
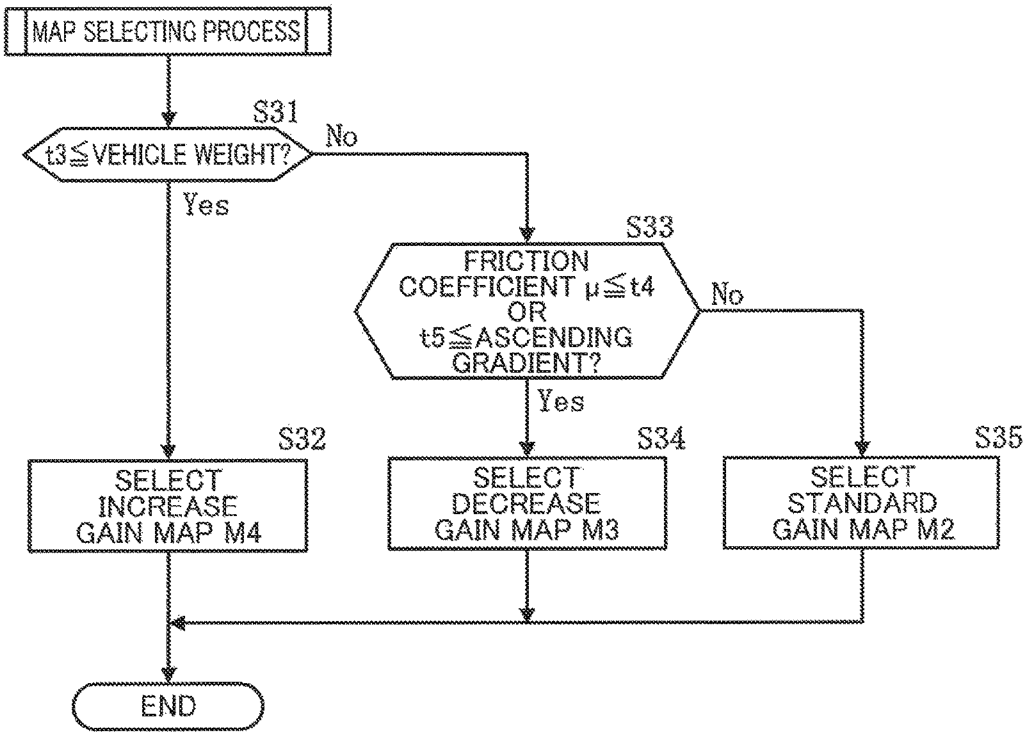
FIG. 7 is a flowchart of a map selecting process.

As illustrated in the flowchart of FIG. 7, in the map selecting process, first, a determination is made in S31 whether a vehicle weight specified based on the number of vehicle occupants and a weight of a cargo is the determination threshold t3 or more.

As a result of the determination in S31, when the vehicle weight is the determination threshold t3 or more, the behavior of the vehicle V might be delayed with respect to the steering angle operation performed by the driver. For this reason, the process goes to S32, the increase gain map M4 is selected, and then the process ends.

As the result of the determination in S31, when the vehicle weight is less than the determination threshold t3, the process goes to S33, and a determination is made whether the friction coefficient μ is the determination threshold t4 or less, or the ascending gradient is the determination threshold t5 or more.

As a result of the determination in S33, when the friction coefficient μ is the determination threshold t4 or less, or the ascending gradient is the determination threshold t5 or more, an actual behavior of the vehicle V might hardly follow a steering angle operation performed by the driver. For this reason, the process goes to S34, the decrease gain map M3 is selected, and then the process ends.

As the result of the determination in S33, when the friction coefficient μ exceeds the determination threshold t4 and the ascending gradient is less than the determination threshold t5, an actual behavior of the vehicle V follows a steering angle operation performed by the driver. Therefore, the process goes to S35, the standard gain map M2 is selected, and then the process ends.

A procedure of the risk degree determining process will be described below.

Figure 8:
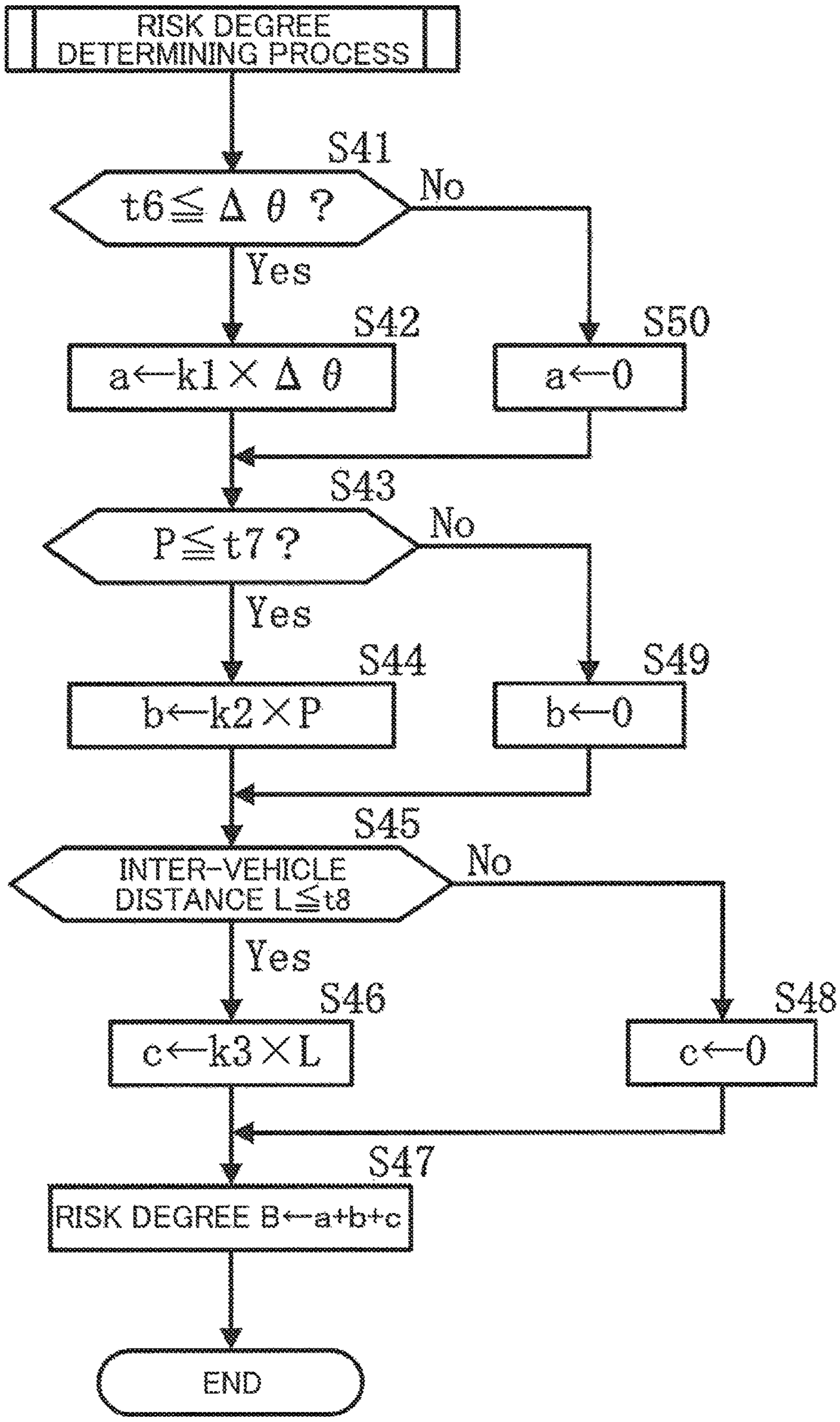
FIG. 8 is a flowchart of a risk degree determining process.

As illustrated in the flowchart of FIG. 8, in the risk degree determining process, first, a determination is made in S41 whether the steering angle speed Δθ is the determination threshold t6 or more.

As a result of the determination in S41, when the steering angle speed Δθ is the determination threshold t6 or more, the process goes to S42. Thereafter, a multiplied value of the steering angle speed Δθ by the correction coefficient k1 is set as the steering angle speed determination amount a.

In S43, a determination is made whether the lateral input amount P is the determination threshold t7 or less.

As a result of the determination in S43, when the lateral input amount P is the determination threshold t7 or less, the process goes to S44 and a multiplied value of the lateral input amount P by the correction coefficient k2 is set as the lateral input amount determination amount b.

In S45, a determination is made whether the inter-vehicle distance L with respect to a leading vehicle or a following vehicle is the determination threshold t8 or less.

As a result of the determination in S45, when the inter-vehicle distance L is the determination threshold t8 or less, the process goes to S46, and a multiplied value of the inter-vehicle distance L by the correction coefficient k3 is set as the inter-vehicle distance determination amount c.

In S47, a value obtained by adding the determination amounts a, b, and c is set as the risk degree B, and then the process ends.

As the result of the determination in S45, when the inter-vehicle distance L exceeds the determination threshold t8, the process goes to S48, and the inter-vehicle distance determination amount c is set to zero. The process then goes to S47.

As the result of the determination in S43, when the lateral input amount P exceeds the determination threshold t7, the process goes to S49, and the lateral input amount determination amount b is set to zero. The process then goes to S45.

As the result of the determination in S41, when the steering angle speed Δθ is less than the determination threshold t6, the process goes to S50, and the steering angle speed determination amount a is set to zero. The process then goes to S43.

A procedure of the discord generating process will be described below.

Figure 9:
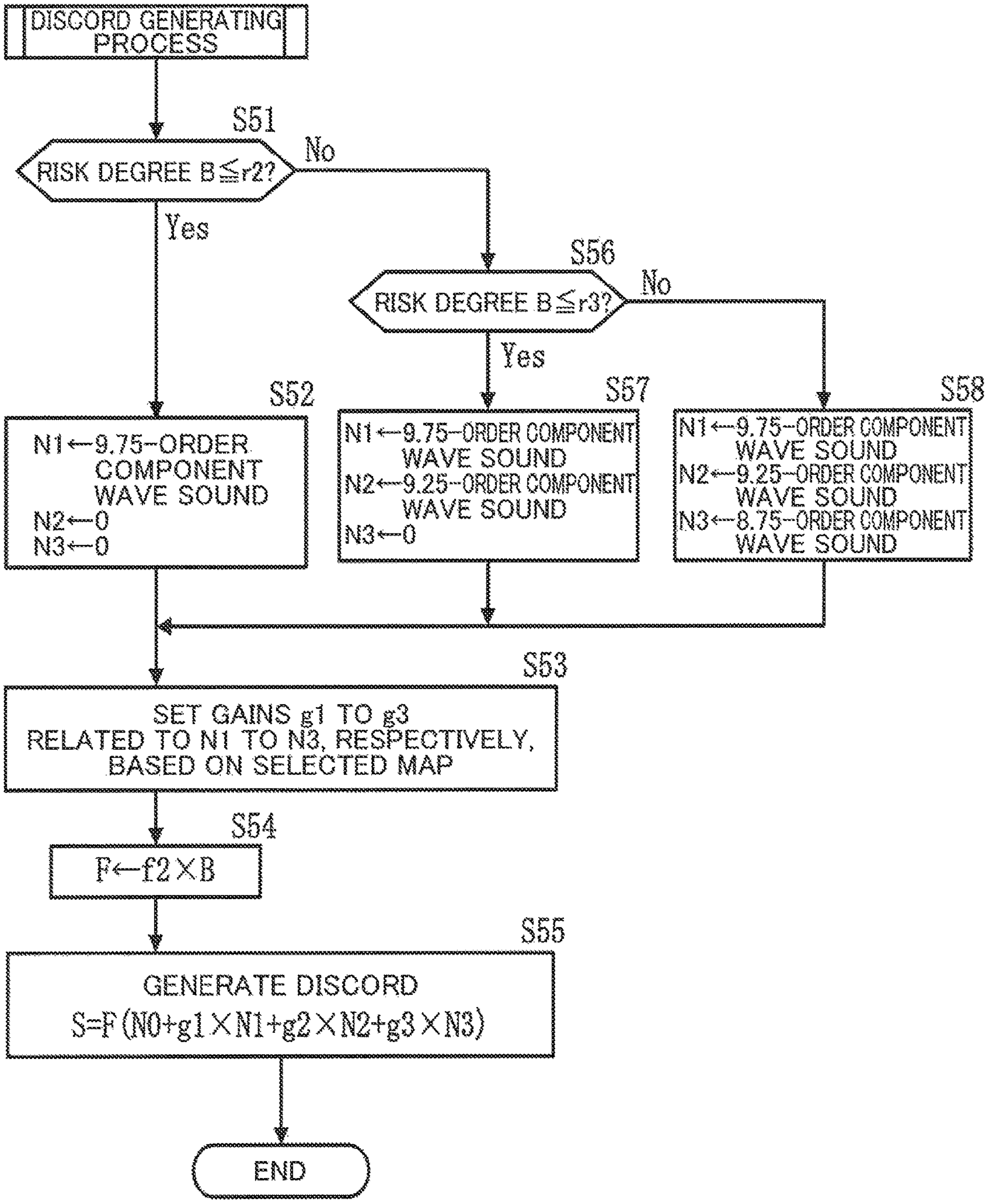
FIG. 9 is a flowchart of a discord generating process.

As illustrated in a flowchart of FIG. 9, in the discord generating process, first, a determination is made in S51 whether the risk degree B is the determination threshold r2 or less.

As a result of the determination in S51, when the risk degree B is the determination threshold r2 or less, the risk degree B is at an intermediate level, and thus the process goes to S52.

In S52, the 9.75-order component sound wave which is the discordant frequency component is set to the first adjustment wave sound N1, and the process goes to S53 without setting the second and third adjustment wave sounds N2 and N3 (in this case, N2 and N3 are zero, the same below).

In S53, the gain g1 (g2, g3) of the adjustment wave sound N1 (N2, N3) set in the previous step is set based on the gain map selected in the map selecting process.

The process then goes to S54, and a multiplied value of the risk degree B by a correction coefficient f2 is set as the sound pressure level correction coefficient F.

In S55, a multiplied value, which is obtained by multiplying an added value of the first adjustment wave sound N1 corrected by the gain g1, the second adjustment wave sound N2 corrected by the gain g2, and the third adjustment wave sound N3 corrected by the gain g3, by the sound pressure level correction coefficient F, is set to the sound effect S. The process then ends.

As the result of the determination in S51, when the risk degree B exceeds the determination threshold r2, the process goes to S56, and a determination is made whether the risk degree B is the determination threshold r3 or less.

As a result of the determination in S56, when the risk degree B is the determination threshold r3 or less, the risk degree B is large. Therefore, the process goes to S57.

In S57, the 9.75-order component sound wave is set to the first adjustment wave sound N1, and the 9.25-order component sound wave which is discordant frequency component is set to the second adjustment wave sound N2. The process goes to S53 without setting the third adjustment wave sound N3.

As the result of the determination in S56, when the risk degree B exceeds the determination threshold r3, the risk degree B is extremely large, and thus the process goes to S58.

In S58, the 9.75-order component sound wave is set to the first adjustment wave sound N1, the 9.25-order component sound wave is set to the second adjustment wave sound N2, and the 8.75-order component wave sound which is the discordant frequency component is set to the third adjustment wave sound N3. Thereafter, the process goes to S53.

A procedure of the harmonic sound generating process will be described below.

Figure 10:
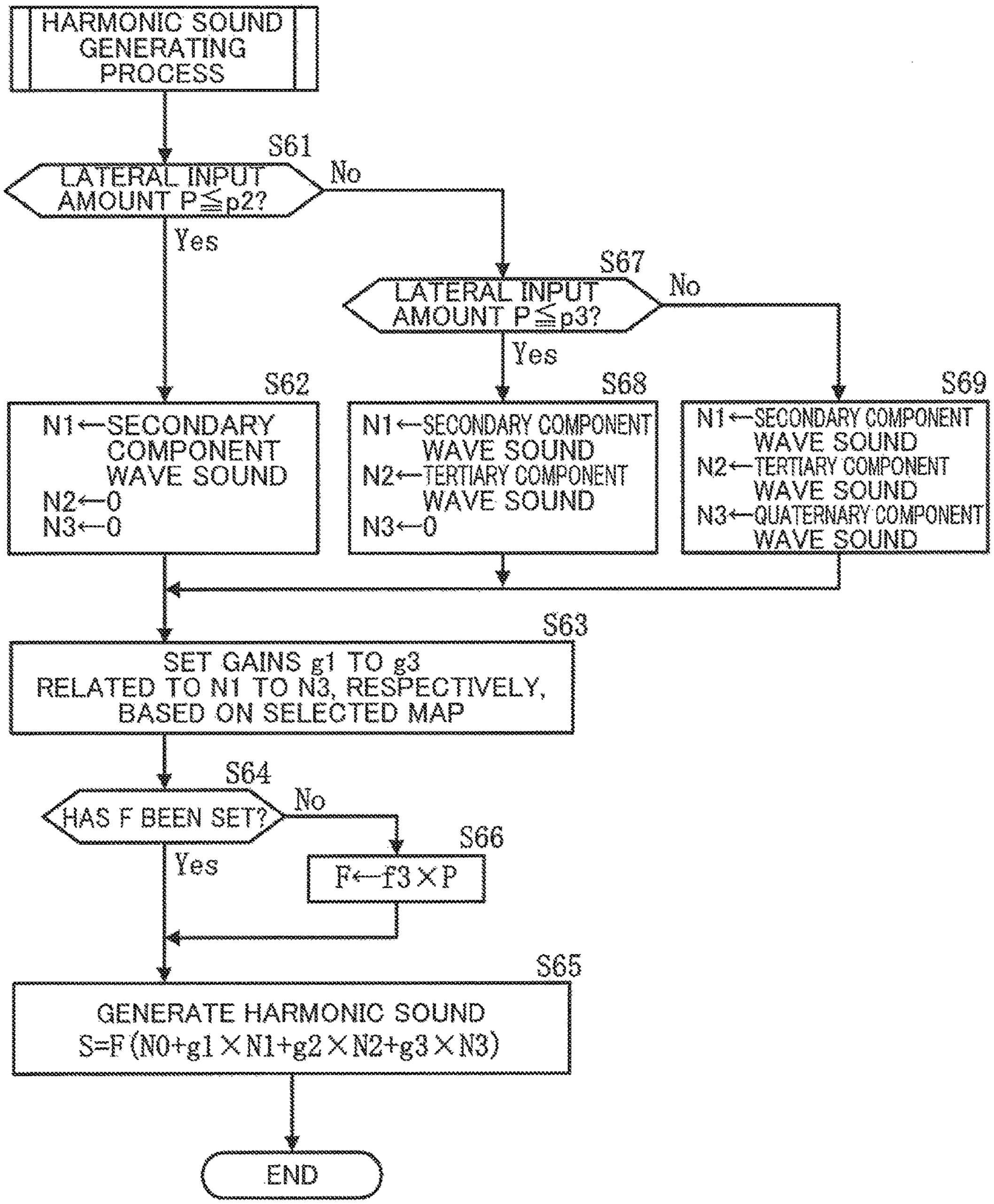
FIG. 10 is a flowchart of a harmonic sound generating process.

As illustrated in the flowchart of FIG. 10, in the harmonic sound generating process, first, a determination is made in S61 whether the lateral input amount P is the determination threshold p2 or less.

As a result of the determination in S61, when the lateral input amount P is the determination threshold p2 or less, the lateral input amount P is at an intermediate level, and thus the process goes to S62.

In S62, the secondary component wave sound which is the integer-order frequency component is set to the first adjustment wave sound N1, and the process goes to S63 without setting the second and third adjustment wave sounds N2 and N3.

In S63, the gain g1 (g2, g3) of the adjustment wave sound N1 (N2, N3) set in the previous step is set based on the gain map selected in the map selecting process.

The process then goes to S64, and a determination is made whether the sound pressure level correction coefficient F has already been set.

As a result of the determination in S64, when the sound pressure level correction coefficient F has already been set, the process goes to S65.

In S65, a multiplied value, which is obtained by multiplying an added value of the first adjustment wave sound N1 corrected by the gain g1, the second adjustment wave sound N2 corrected by the gain g2, and the third adjustment wave sound N3 corrected by the gain g3, by the sound pressure level correction coefficient F, is set to the sound effect S. The process then ends.

As the result of the determination in S64, when the sound pressure level correction coefficient F has not yet been set, the process goes to S66.

In S66, a multiplied value of the lateral input amount P by a correction coefficient f3 is set as the sound pressure level correction coefficient F, and then the process goes to S65.

As the result of the determination in S61, when the lateral input amount P exceeds the determination threshold p2, the process goes to S67. A determination is made whether the lateral input amount P is the determination threshold p3 or less.

As a result of the determination in S67, when the lateral input amount P is the determination threshold p3 or less, the lateral input amount P is large, and thus the process goes to S68.

In S68, the secondary component wave sound is set to the first adjustment wave sound N1, and the tertiary component wave sound which is the integer-order frequency component is set to the second adjustment wave sound N2. The process goes to S63 without setting the third adjustment wave sound N3.

As the result of the determination in S67, when the lateral input amount P exceeds the determination threshold p3, the lateral input amount P is extremely large, and thus the process goes to S69.

In S69, the secondary component wave sound is set to the first adjustment wave sound N1, the tertiary component wave sound is set to the second adjustment wave sound N2, and the quaternary component wave sound N which is the integer-order frequency component is set to the third adjustment wave sound N3. The process then goes to S63.

A procedure of the rumble sound generating process will be described below.

Figure 11:
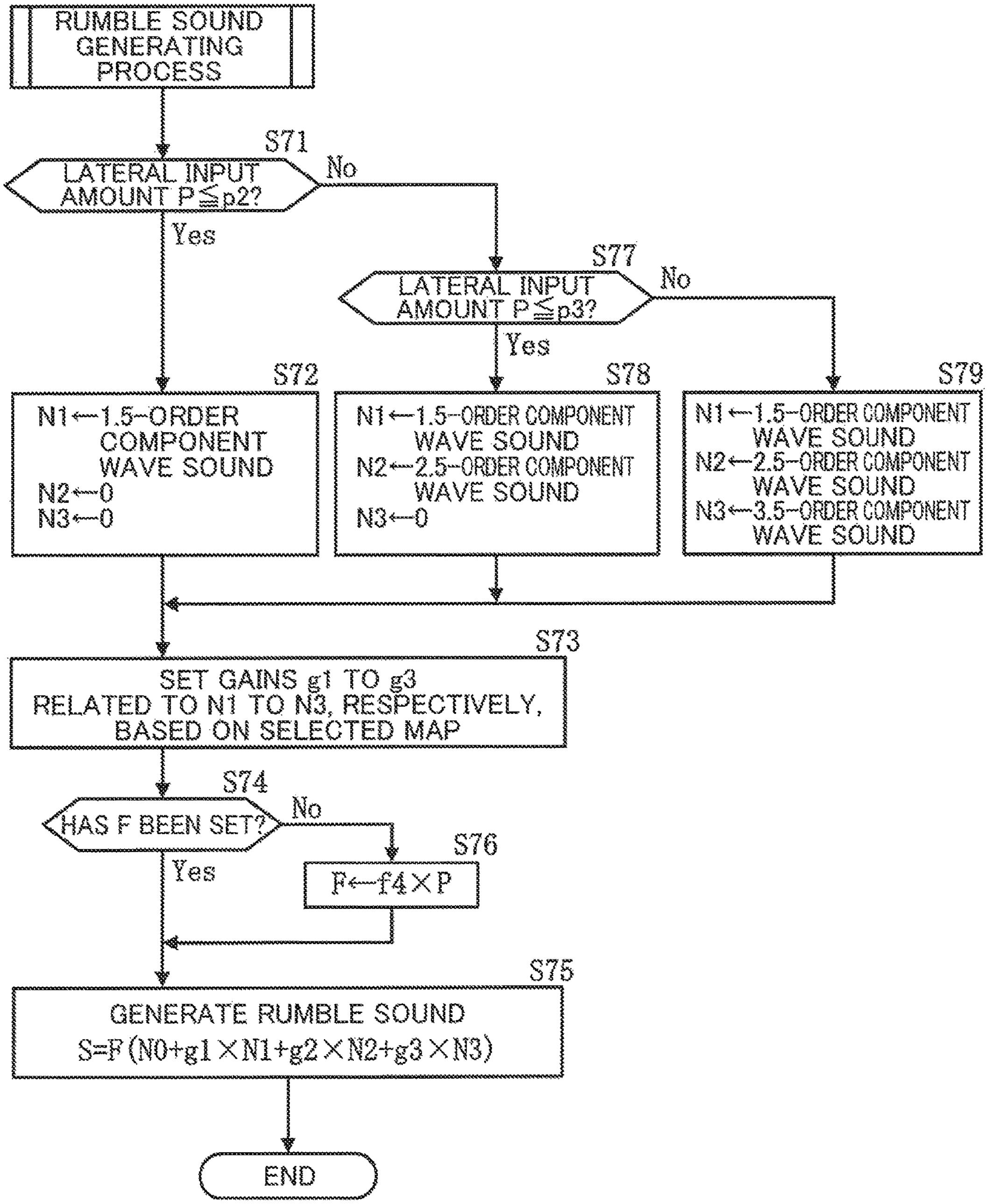
FIG. 11 is a flowchart of a rumble sound generating process.

As illustrated in the flowchart of FIG. 11, in the rumble sound generating process, first, a determination is made in S71 whether the lateral input amount P is the determination threshold p2 or less.

As a result of the determination in S71, when the lateral input amount P is the determination threshold p2 or less, the lateral input amount P is at an intermediate level, and thus the process goes to S72.

In S72, the 1.5-order component wave sound which is the half-order frequency component is set to the first adjustment wave sound N1, and the process goes to S73 without setting the second and third adjustment wave sounds N2 and N3.

In S73, the gain g1 (g2, g3) of the adjustment wave sound N1 (N2, N3) set in the previous step is set based on the gain map selected in the map selecting process.

The process then goes to S74, and a determination is made whether the sound pressure level correction coefficient F has already been set.

As a result of the determination in S74, when the sound pressure level correction coefficient F has already been set, the process goes to S75.

In S75, a multiplied value, which is obtained by multiplying an added value of the first adjustment wave sound N1 corrected by the gain g1, the second adjustment wave sound N2 corrected by the gain g2, and the third adjustment wave sound N3 corrected by the gain g3, by the sound pressure level correction coefficient F, is set to the sound effect S. The process then ends.

As the result of the determination in S74, when the sound pressure level correction coefficient F has not yet been set, the process goes to S76.

In S76, a multiplied value of the lateral input amount P by a correction coefficient f4 is set as the sound pressure level correction coefficient F, and then the process goes to S65.

As the result of the determination in S71, when the lateral input amount P exceeds the determination threshold p2, the process goes to S77 and a determination is made whether the lateral input amount P is the determination threshold p3 or less.

As a result of the determination in S77, when the lateral input amount P is the determination threshold p3 or less, the lateral input amount P is large, and thus the process goes to S78.

In S78, the 1.5-order component wave sound is set to the first adjustment wave sound N1, the 2.5-order component wave sound which is the half-order frequency component is set to the second adjustment wave sound N2. The process then goes to S73 without setting the third adjustment wave sound N3.

As the result of the determination in S77, when the lateral input amount P exceeds the determination threshold p3, the lateral input amount P is extremely large, and thus the process goes to S79.

In S79, the 1.5-order component wave sound is set to the first adjustment wave sound N1, the 2.5-order component wave sound is set to the second adjustment wave sound N2, and the 3.5-order component wave sound which is the half-order frequency component is set to the third adjustment wave sound N3. The process then goes to S73.

A procedure of the weight setting process will be described below.

Figure 12:
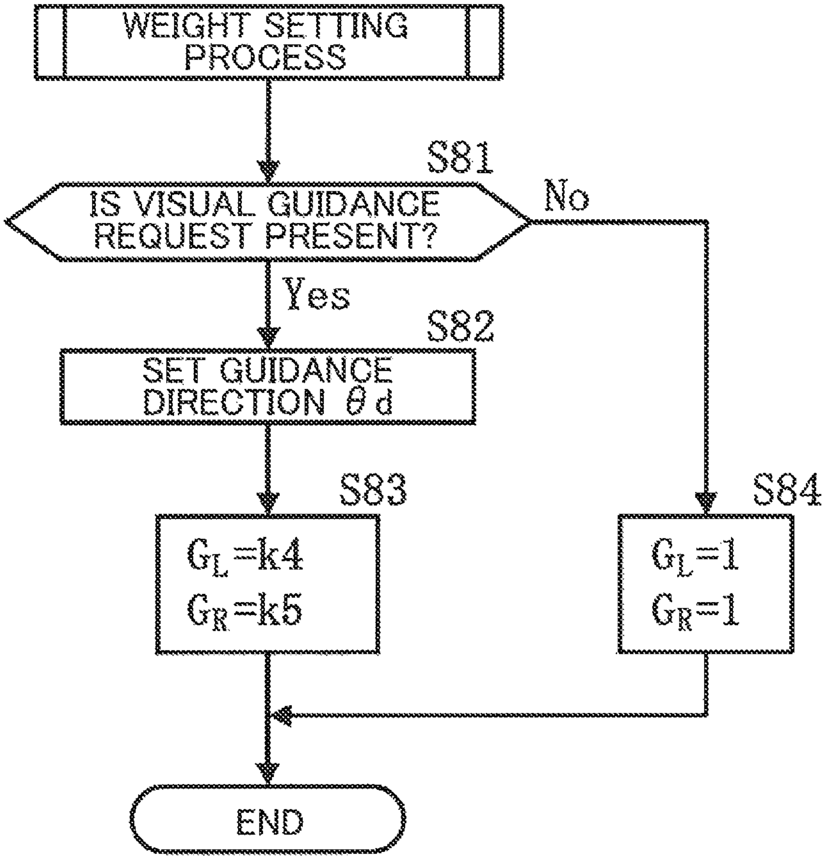
FIG. 12 is a flowchart of a weight setting process.

As illustrated in the flowchart of FIG. 12, in the weight setting process, first, the visual guidance direction setting unit 28 determines in S81 whether the visual guidance request is present.

As a result of the determination in S81, when the visual guidance request is present, the sound pressure levels of the right and left speakers 3 and 4 are necessarily differentiated. Therefore, the process goes to S82 and the visual guidance direction θd is set.

The process then goes to S83, and the sound pressure level correction coefficients $G_L$ and $G_R$ are set to the correction coefficients k4 and k5, respectively, based on the visual guidance direction θd. Thereafter, the process ends.

As the result of the determination in S81, when the visual guidance request is not present, the sound pressure levels of the right and left speakers 3 and 4 are not necessarily differentiated. Therefore, the sound pressure level correction coefficients $G_L$ and $G_R$ are set to 1, and the process ends.

A function and an effect of the vehicle sound effect generation apparatus 1 will be described below.

Since the sound effect generation apparatus 1 includes the risk degree determining unit 25 that can determine the risk degree B of the vehicle V based on the running state detected by the sensors 6 to 8 and the drive assist device 14 (the running state detecting unit), the risk degree B in which an actual vehicle behavior is reflected can be determined.

Further, the sound effect generation unit 27 is provided that synthesizes the fundamental wave sound N0 with the first to third adjustment wave sounds N1 to N3 having a discordant frequency component other than an integer-order frequency component and a half-order frequency component when the risk degree determining unit 25 determines the risk degree B which is the determination threshold r1 or more. For this reason, a discord adaptable to an actual vehicle behavior is generated so that vehicle occupant's nervousness and sense of caution can be heightened.

The sound effect generation apparatus 1 includes the adjustment wave sound selector 22 that selects, based on the risk degree B, the first to third adjustment wave sounds N1 to N3 having a discordant frequency component other than an integer-order frequency component and a half-order frequency component and outputs the selected first to third adjustment wave sounds N1 to N3 to the sound effect generation unit 27. The adjustment wave sound selector 22 increases, as the risk degree B is larger, the number of the first to third adjustment wave sounds N1 to N3 to be synthesized with the fundamental wave sound N0. For this reason, the number of acoustic presentation effects can be increased while a discordant level is maintained.

Since the sound effect generation unit 27 increases the sound pressure level of the sound effects S ($S_L$, $S_R$) as the risk degree B is larger. For this reason, nervousness and sense of caution recognized by a vehicle occupant can be further heightened in accordance with the risk degree B.

The adjustment wave sound selector 22 selects, from the plurality of discordant adjustment wave sounds included in the vibration sound map M1, at least the discordant adjustment wave sound N1 which is farthest from the fundamental frequency component and is midway between an integer-order frequency component and a half-order frequency component. For this reason, an interference with the fundamental wave sound N0 can be increased, and thus a discord having uncomfortableness can be generated.

When the adjustment wave sound selector 22 selects the first to third adjustment wave sounds N1 to N3, the adjustment wave sound selector 22 increases the gains g1 to g3 of the discordant adjustment wave sounds as the discordant frequency components are farther from the fundamental frequency component. For this reason, nervousness and sense of caution recognized by a vehicle occupant can be further enhanced.

The adjustment wave sound selector 22 is configured to be capable of selecting the first to third adjustment wave sounds N1 to N3 having an integer-order frequency component or the first to third adjustment wave sounds N1 to N3 having a half-order frequency component. The sound effect generation unit 27 is configured to be capable of synthesizing the fundamental wave sound N0 with the first to third adjustment wave sounds N1 to N3 having an integer-order frequency component or a half-order frequency component. When the risk degree B is the determination threshold r1 or more, the sound effect generation unit 27 executes a third mode which is given priority over a first mode and a second mode. In the third mode, discordant adjustment wave sounds are selected as the first to third adjustment wave sounds N1 to N3, and the discordant adjustment wave sounds are synthesized with the fundamental wave sound N0. In the first mode, integer-order adjustment wave sounds are selected as the first to third adjustment wave sounds N1 to N3, and the integer-order adjustment wave sounds are synthesized with the fundamental wave sound N0. In the second mode, half-order adjustment wave sounds are selected as the first to third adjustment wave sounds N1 to N3, and the half-order adjustment wave sounds are synthesized with the fundamental wave sound N0.

With this configuration, various acoustic presentation effects can be provided by a harmonic sound and a rumble sound that do not make a vehicle occupant uncomfortable, and vehicle occupant's attention can be securely drawn.

A modified example in which the embodiment is partially changed will be described below.

[1] In the above embodiment, the number of adjustment wave sounds to be synthesized with a fundamental wave sound can be set to at most 3 based on a running state, but the number of the adjustment wave sounds may be set to 2 or 4 or more according to a specification, a running environment, and a state of the vehicle V. When the number of adjustment wave sounds is set to 4 or more, the number of gains defined in the gain maps M2 to M4 is preferably set according to the number of set adjustment wave sounds.

[2] In the above embodiment, the sound effect generation unit changes the sound pressure levels of the pair of right and left speakers so that the localized direction of a sound image is changed. However, the localized direction of a sound image may be changed by setting a delay time of a sound effect to reach the driver while the sound pressure levels of the pair of speakers are maintained without changing the sound pressure levels of the pair of speakers.

Specifically, an output from the speaker on a side opposite to the visual guidance direction is delayed from an output from the visual guidance direction-side speaker, so that the localized direction of a sound image can be moved toward the visual guidance direction.

Further, in order to heighten recognition by the driver, the localized direction of a sound image may be shifted linearly from the frontal direction of the driver through the visual guidance direction, and this shifting operation may be repeated.

Further, speakers may be movable. In addition to the pair of speakers, a speaker may be additionally disposed above the pair of speakers so that the visual guidance direction can be set three-dimensionally.

[3] The above embodiment has described an example of the drive assist device having the inter-vehicle distance notifying function and the feeling improving function. However, the drive assist device can detect at least an outside-vehicle situation and an in-vehicle situation, and thus may have an obstacle detecting function or a white line (of a driving lane) detecting function.

Further, detecting means may be means other than a CCD, and thus may be, for example, a millimeter-wave radar.

[4] The above embodiment has described an example in which the sound effect generation apparatus that generates a sound effect of an engine based on a lateral input amount is used in combination. However, the sound effect generation apparatus just has to generate a discordant sound effect of an engine based on at least the risk degree. Therefore, a sound effect generation apparatus that generates a sound effect of an engine based on an accelerator opening degree may be used in combination. When an engine sound effect is generated based on the accelerator opening degree, one integer or half-order adjustment wave sound or a plurality of integer or half-order adjustment wave sounds and their gains are set based on the accelerator opening degree. Further, control is made such that the number of adjustment wave sounds to be synthesized with the fundamental wave sound, gain values for correcting these adjustment wave sounds, and a sound pressure level of a sound effect increase as the accelerator opening degree is larger.

[5] The above embodiment has described an example where the vibration sound map is used. However, a vibration sound map may be prepared for each engine specification such as displacement or the number of cylinders so that a vibration sound map according to an engine specification can be selected when a mounted engine is replaced.

The above embodiment has described an example using the vibration sound map of the four-cylinder gasoline engine actually mounted to a vehicle. However, a sound effect may be generated by using a vibration sound map of any internal combustion (for example, a four-cylinder gasoline engine) for a hybrid vehicle or an electric vehicle.

[6] Embodiments obtained by applying various modifications of which a person skilled in the art thinks to the embodiments may be included within a range of the present invention as long as they do not deviate from the subject matter of the present invention.

Summary of the Embodiment

The above embodiment will be summarized as follows.

The above embodiment relates to a vehicle sound effect generation apparatus for generating a sound effect of an engine based on a vibration sound database including a fundamental wave sound having a fundamental frequency component and a plurality of adjustment wave sounds having a frequency component other than the fundamental frequency component. The vehicle sound effect generation apparatus includes the running state detecting unit that detects a running state of a vehicle, the risk degree determining unit that is capable of determining a risk degree of the vehicle based on the running state detected by the running state detecting unit, and the sound effect generation unit that, when the risk degree determining unit determines a risk degree which is a predetermined value or more, synthesizes the fundamental wave sound with one or more discordant adjustment wave sounds having a discordant frequency component other than an integer-order frequency component and a half-order frequency component.

The vehicle sound effect generation apparatus includes the running state detecting unit that detects a running state of a vehicle, and the risk degree determining unit that is capable of determining a risk degree of the vehicle based on the running state detected by the running state detecting unit. For this reason, a risk degree in which an actual vehicle behavior is reflected can be determined.

Further, the sound effect generation unit is provided that synthesizes the fundamental wave sound with one or more discordant adjustment wave sounds having a discordant frequency component other than an integer-order frequency component and a half-order frequency component when the risk degree determining unit determines the risk degree which is a predetermined value or more. For this reason, a discord adaptable to an actual vehicle behavior is generated so that vehicle occupant’s nervousness and sense of caution can be heightened.

Preferably, the vehicle sound effect generation apparatus further includes the adjustment wave sound selector that selects, based on the risk degree, the one or more discordant adjustment wave sounds having the discordant frequency component other than the integer-order frequency component and the half-order frequency component and outputs the one or more discordant adjustment wave sounds to the sound effect generation unit. The adjustment wave sound selector increases, as the risk degree is larger, the number of the discordant adjustment wave sounds to be synthesized with the fundamental wave sound.

This configuration makes it possible to increase the number of acoustic presentation effects while a discordant level is maintained.

Preferably, the sound effect generation unit increases a sound pressure level of the sound effect as the risk degree is larger.

This configuration can further enhance nervousness and sense of caution recognized by a vehicle occupant in accordance with a risk degree.

Preferably, the adjustment wave sound selector selects, from the discordant adjustment wave sounds included in the vibration sound database, at least a discordant adjustment wave sound which is farthest from the fundamental frequency component and is midway between the integer-order frequency component and the half-order frequency component.

This configuration can increase an interference with the fundamental wave sound and can generate a discord which is uncomfortable.

Preferably, when selecting the discordant adjustment wave sounds, the adjustment wave sound selector increases gains of the discordant adjustment wave sounds as the discordant frequency components are farther from the fundamental frequency component.

This configuration can enhance nervousness and sense of caution recognized by a vehicle occupant.

Preferably, the adjustment wave sound selector is configured to be capable of selecting one or more integer-order adjustment wave sounds having the integer-order frequency component, or one or more half-order adjustment wave sounds having the half-order frequency component, and the sound effect generation unit is configured to be capable of synthesizing the fundamental wave sound with the one or more integer-order adjustment wave sounds or the one or more half-order adjustment wave sounds, and when the risk degree is determined to be the predetermined value or more, executes a third mode for synthesizing the fundamental wave sound with the one or more discordant adjustment wave sounds, the third mode being given priority over a first mode for synthesizing the fundamental wave sound with the one or more integer-order adjustment wave sounds, and a second mode for synthesizing the fundamental wave sound with the one or more half-order adjustment wave sounds.

With this configuration, various acoustic presentation effects can be provided by a harmonic sound and a rumble sound that do not make a vehicle occupant uncomfortable, and vehicle occupant’s attention can be securely drawn.

The invention claimed is:

1. A vehicle sound effect generation apparatus for generating a sound effect of an engine based on a vibration sound database including a fundamental wave sound having a fundamental frequency component and a plurality of adjustment wave sounds having a frequency component other than the fundamental frequency component, the vehicle sound effect generation apparatus comprising:

a running state detecting unit that detects a running state of a vehicle;

a risk degree determining unit that is capable of determining a risk degree of the vehicle based on the running state detected by the running state detecting unit;

a sound effect generation unit that, when the risk degree determining unit determines a risk degree which is a predetermined value or more, synthesizes the fundamental wave sound with one or more discordant adjustment wave sounds having a discordant frequency component other than an integer-order frequency component and a half-order frequency component; and an adjustment wave sound selector that selects the one or more discordant adjustment wave sounds based on the risk degree, and outputs the one or more discordant adjustment wave sounds to the sound effect generation unit, wherein the adjustment wave sound selector increases, as the risk degree is larger, a number of the discordant adjustment wave sounds to be synthesized with the fundamental wave sound.

2. The vehicle sound effect generation apparatus according to claim 1, wherein the sound effect generation unit increases a sound pressure level of the sound effect as the risk degree is larger.

3. The vehicle sound effect generation apparatus according to claim 1, wherein the adjustment wave sound selector selects, from the discordant adjustment wave sounds included in the vibration sound database, at least a discordant adjustment wave sound which is farthest from the fundamental frequency component and is midway between the integer-order frequency component and the half-order frequency component.

4. The vehicle sound effect generation apparatus according to claim 1, wherein when selecting the discordant adjustment wave sounds, the adjustment wave sound selector increases gains of the discordant adjustment wave sounds as the discordant frequency components are farther from the fundamental frequency component.

5. The vehicle sound effect generation apparatus according to claim 1, wherein the adjustment wave sound selector is configured to be capable of selecting one or more integer-order adjustment wave sounds having the integer-order frequency component, or one or more half-order adjustment wave sounds having the half-order frequency component, and the sound effect generation unit is configured to be capable of synthesizing the fundamental wave sound with the one or more integer-order adjustment wave sounds or the one or more half-order adjustment wave sounds, and when the risk degree is determined to be the predetermined value or more, executes a third mode for synthesizing the fundamental wave sound with the one or more discordant adjustment wave sounds, the third mode being given priority over a first mode for synthesizing the fundamental wave sound with the one or more integer-order adjustment wave sounds, and a second mode for synthesizing the fundamental wave sound with the one or more half-order adjustment wave sounds.

* * * * *